United States Patent
Mazzillo et al.

(10) Patent No.: US 10,209,125 B2
(45) Date of Patent: Feb. 19, 2019

(54) MONOLITHIC INTEGRATION OF ULTRAVIOLET AND INFRARED RADIATION DETECTORS AND MANUFACTURING PROCESS THEREOF

(71) Applicant: STMICROELECTRONICS S.R.L., Agrate Brianza (IT)

(72) Inventors: Massimo Cataldo Mazzillo, Corato (IT); Antonella Sciuto, S.Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/920,200

(22) Filed: Mar. 13, 2018

(65) Prior Publication Data

US 2018/0202859 A1 Jul. 19, 2018

Related U.S. Application Data

(62) Division of application No. 15/375,741, filed on Dec. 12, 2016, now Pat. No. 9,952,094.

(51) Int. Cl.
*H01L 31/107* (2006.01)
*G01J 1/42* (2006.01)
(Continued)

(52) U.S. Cl.
CPC .............. *G01J 1/429* (2013.01); *F23N 5/082* (2013.01); *G01J 5/0014* (2013.01); *G01J 5/20* (2013.01);
(Continued)

(58) Field of Classification Search
None
See application file for complete search history.

(56) References Cited

U.S. PATENT DOCUMENTS

| 2009/0114819 A1 | 5/2009 | Yamanaka et al. |
| 2009/0184317 A1* | 7/2009 | Sanfilippo ........... H01L 27/1446 257/49 |

(Continued)

FOREIGN PATENT DOCUMENTS

| JP | H07 221341 A | 8/1995 |
| JP | H08 330558 A | 12/1996 |

(Continued)

OTHER PUBLICATIONS

"Flame Tracker Flame Tracker Improves Performance and Availability of Your Gas Turbine," GE Measurement & Control, 2015.

(Continued)

*Primary Examiner* — Ermias Woldegeorgis
(74) *Attorney, Agent, or Firm* — Seed IP Law Group LLP

(57) ABSTRACT

A semiconductor device for flame detection, including: a semiconductor body having a first conductivity type conductivity, delimited by a front surface and forming a cathode region; an anode region having a second conductivity type conductivity, which extends within the semiconductor body, starting from the front surface, and forms, together with the cathode region, the junction of a photodiode that detect ultraviolet radiation emitted by the flames; a supporting dielectric region; and a sensitive region, which is arranged on the supporting dielectric region and varies its own resistance as a function of the infrared radiation emitted by the flames.

20 Claims, 19 Drawing Sheets

(51) Int. Cl.
| | |
|---|---|
| H01L 31/0224 | (2006.01) |
| H01L 31/0312 | (2006.01) |
| H01L 31/0352 | (2006.01) |
| H01L 31/0216 | (2014.01) |
| H01L 31/0232 | (2014.01) |
| H01L 31/02 | (2006.01) |
| H01L 31/18 | (2006.01) |
| F23N 5/08 | (2006.01) |
| G01J 5/00 | (2006.01) |
| H01L 31/103 | (2006.01) |
| H01L 31/09 | (2006.01) |
| G01J 5/20 | (2006.01) |
| H01L 27/146 | (2006.01) |

(52) U.S. Cl.
CPC .... *H01L 27/1467* (2013.01); *H01L 27/14609* (2013.01); *H01L 27/14669* (2013.01); *H01L 31/02027* (2013.01); *H01L 31/02164* (2013.01); *H01L 31/02327* (2013.01); *H01L 31/022408* (2013.01); *H01L 31/022416* (2013.01); *H01L 31/0312* (2013.01); *H01L 31/035281* (2013.01); *H01L 31/09* (2013.01); *H01L 31/103* (2013.01); *H01L 31/107* (2013.01); *H01L 31/1035* (2013.01); *H01L 31/1812* (2013.01); *H01L 27/14625* (2013.01)

(56) References Cited

U.S. PATENT DOCUMENTS

| | | |
|---|---|---|
| 2010/0065744 A1 | 3/2010 | Ouvrier-Buffet |
| 2012/0139074 A1 | 6/2012 | Abe |
| 2014/0231951 A1 | 8/2014 | Yoon et al. |

FOREIGN PATENT DOCUMENTS

| | | |
|---|---|---|
| JP | 3 349012 B2 | 11/2002 |
| JP | 2009-258000 A | 11/2009 |

OTHER PUBLICATIONS

"High Performance Low Cost Flame Detection," Spectrex Inc. SharpEye™ 20/20M "Mini" Flame Detection Series, 8 pages, 2014.

"Model FL4000H Multi-Spectral Infrared Flame Detector," General Monitors by MSA, 72 pages.

"Quick Detection of Flame from Distance, Compact UV Sensor with High Sensitivity and Wide Directivity Suitable for Flame Detectors and Fire Alarms," Hamamatsu Flame Sensor UVTRON® R2868, 2 pages, 2014.

"UVIR Flame Detector X5200," Detector Electronics Corporation, 2 pages, 2014.

"UV Flame Detector X2200," Detector Electronics Corporation, 2 pages, 2014.

Yan et al., "Demonstration of the First 4H—SiC Avalanche Photodiodes," *Solid State Electronics* (44) pp. 341-346, 2000.

* cited by examiner

MONOLITHIC INTEGRATION OF ULTRAVIOLET AND INFRARED RADIATION DETECTORS AND MANUFACTURING PROCESS THEREOF

BACKGROUND

Technical Field

The present disclosure relates to a semiconductor device for detecting ultraviolet and infrared radiation; moreover, the present disclosure relates to the process for manufacturing this semiconductor device.

Description of the Related Art

As is known, so-called flame sensors are today available, which are devices designed to detect the presence of flames. These sensors are commonly used both in the industrial field (for example, in order to verify that a furnace plant is operating properly), and in the domestic field (for example, in order to detect possible gas leaks accompanied by explosions).

The flames that are generated following upon combustion of hydrocarbons are accompanied by simultaneous emission of electromagnetic radiation in the ultraviolet spectral region, i.e., radiation with wavelengths comprised between 100 nm and 400 nm, as well as in the infrared spectral region, i.e., radiation with wavelengths comprised between 700 nm and 3 µm.

This having been said, some proposed flame sensors are formed by ultraviolet sensors based upon corresponding gas photomultiplier tubes, the optical response of which is intrinsically zero above 260 nm. Gas photomultiplier tubes are characterized by high sensitivity, enable detection of weak ultraviolet radiation, and are insensitive to spurious ultraviolet radiation (i.e., radiation not associated with flames), which has a wavelength comprised between 280 nm and 380 nm and is generated, for example, by sunlight or by arc lamps. However, gas photomultiplier tubes have high costs and large overall dimensions.

Some proposed flame sensors are formed by ultraviolet sensors based upon corresponding solid-state detectors, which are, however, sensitive also to sunlight and to the aforementioned spurious ultraviolet radiation. Furthermore, the use of ultraviolet sensors is limited to indoor and short-range applications since ultraviolet radiation undergoes a high attenuation in the presence, for example, of dust, smoke, hydrocarbon vapours, etc.

Some proposed flame sensors are formed by infrared sensors, which may be used also in the case of outdoor applications, as well as over long distances. However, they may generate false alarms owing to emission of infrared radiation by sources that are not dangerous (for example, matches), or else to emission of black-body radiation by objects at high temperature (for example, hot metal objects).

In order to reduce false alarms as much as possible, generally current flame sensors simultaneously detect the presence of ultraviolet and infrared radiation in amounts higher than corresponding threshold levels.

In greater detail, there are currently known flame sensors that comprise a corresponding detector of ultraviolet radiation, formed by a gas photomultiplier tube, and a corresponding detector of infrared radiation, formed, for example, by a so-called pyroelectric detector. In other words, each flame sensor is formed by two distinct detectors, one of which is designed to detect radiation in the ultraviolet spectral region and the other in the infrared spectral region on the basis of different physical phenomena. Such flame sensors are thus combined ultraviolet and infrared radiation sensors.

Flame sensors of a combined type are characterized in any case by large overall dimensions, as well as by high costs. Furthermore, prior art flame sensors of a combined type require generation of high voltages in order to drive the gas photomultiplier tubes, and have a low sensitivity in the infrared, since pyroelectric sensors have a low sensitivity.

BRIEF SUMMARY

According to one or more embodiments of the disclosure, a semiconductor device for flame detection includes:
a semiconductor body having a first conductivity type and a front surface and including a cathode region;
an anode region having a second conductivity type, which extends within said semiconductor body, starting from the front surface, and forms, together with the cathode region, a junction of a photodiode configured to detect ultraviolet radiation emitted by the flames;
a supporting dielectric region on the semiconductor body; and
a sensitive region arranged on the supporting dielectric region and configured to have a resistance that varies as a function of infrared radiation emitted by the flames.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

Figure 1:
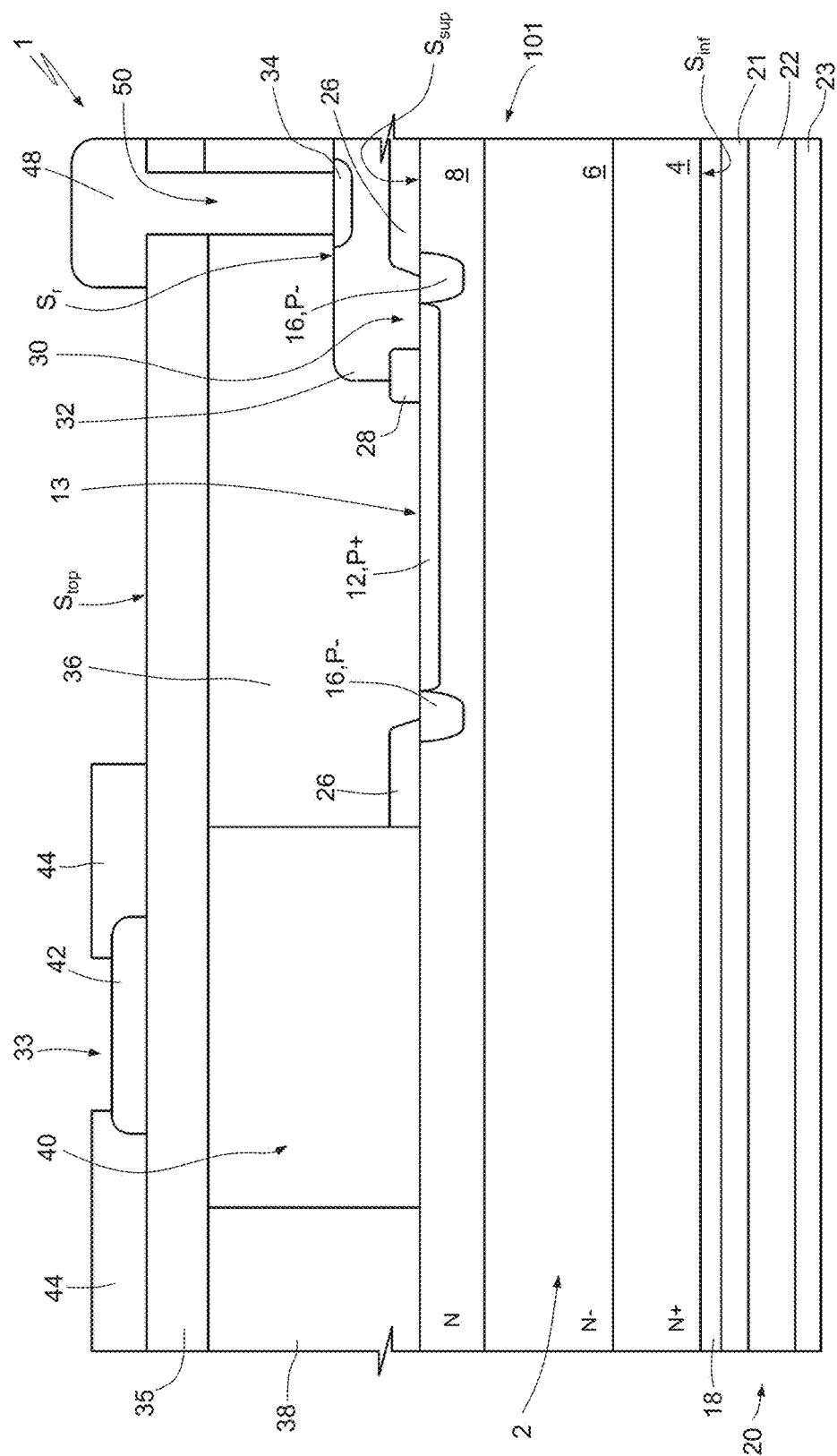
FIG. 1 is a schematic cross-sectional view of an embodiment of the present photodiode.

FIG. 1 shows an example of embodiment of a semiconductor device 1, which is integrated in a first die 101. FIG. 1 and the subsequent figures are not in scale.

In detail, the semiconductor device 1 comprises a semiconductor body 2, for example of silicon carbide. In particular, the semiconductor body 2 may be made of silicon carbide of a 4H polytype (4H—SiC).

The semiconductor body 2 includes a substrate 4 of an N+ type, which is delimited at the bottom by a bottom surface $S_{inf}$, and has a thickness, for example, of 350 μm; moreover, the substrate 4 is doped, for example, with nitrogen and has a doping level of, for example, $1 \cdot 10^{19}$ cm$^{-3}$. Without any loss of generality, in what follows it is assumed, wherever not expressly indicated, that the doping of an N type is obtained using nitrogen as dopant.

The semiconductor body 2 further comprises a first epitaxial layer 6 and a second epitaxial layer 8.

The first epitaxial layer 6 is arranged on the substrate 4, is of an N− type, has a thickness of, for example, 4 μm and a doping level of, for example, $1 \cdot 10^{14}$ cm$^{-3}$.

The second epitaxial layer 8 overlies, in direct contact, the first epitaxial layer 6, is of an N type, has a thickness of, for example, 1 μm and has a doping level of, for example, $5 \cdot 10^{17}$ cm$^{-3}$. The second epitaxial layer 8 forms a top surface $S_{sup}$, which delimits the semiconductor body 2 at the top.

An anode region 12, of a P+ type and having a shape, in top plan view, that is circular or polygonal (for example, quadrangular), extends in a top portion of the second epitaxial layer 8, starting from the top surface $S_{sup}$, without extending in a bottom portion of the second epitaxial layer 8 or in the first epitaxial layer 6. The anode region 12 is doped, for example, with aluminium, has a thickness, for example, comprised between 0.05 μm and 0.25 μm, and has a peak doping level of, for example, $5 \cdot 10^{18}$ cm$^{-3}$.

The semiconductor device 1 further comprises a guard ring 16, which is of a P− type and extends only in the second epitaxial layer 8, starting from the top surface $S_{sup}$ for surrounding the anode region 12 laterally. The guard ring 16 is doped, for example, with aluminium, has a thickness greater than the thickness of the anode region 12, and has a peak doping level of, for example, $1 \cdot 10^{18}$ cm$^{-3}$.

For practical purposes, the anode region 12, the second epitaxial layer 8, and the first epitaxial layer 6 form a PNI junction of a photodiode 13, since the electrical behaviour of the first epitaxial layer 6 may be considered as equivalent to that of an intrinsic layer. The second epitaxial layer 8 thus functions as cathode region. The PNI junction is designed to receive photons and to generate avalanche currents, as described in detail hereinafter.

In greater detail, the PNI junction is such that, straddling the interface between the anode region 12 and the second epitaxial layer 8, a depleted region is formed, which, thanks to the doping of the anode region 12, does not extend up to the top surface $S_{sup}$, nor does it extend within the first epitaxial layer 6. Consequently, the photodiode 13 is characterized by a low breakdown voltage (of the order of a few tens of volts), without this penalising the sensitivity of the photodiode 13. In fact, the carriers generated within the first epitaxial layer 6 following upon absorption of photons have long lifetimes, thanks to the low doping of the first epitaxial layer 6, and manage to reach the depleted region, where they may trigger the so-called avalanche phenomenon.

In greater detail, the photodiode 13 may function as a Geiger-mode avalanche photodiode (GM-APD), also known as single-photon avalanche diode (SPAD). For this purpose, the photodiode 13 is reverse-biased at a voltage higher, in modulus, than the breakdown voltage. In this way, generation of a single electron-hole pair, following upon absorption of a photon incident upon the photodiode 13, is sufficient to trigger a process of ionisation that causes an avalanche multiplication of the carriers, with gains of around $10^6$ and consequent generation in short times (hundreds of picoseconds) of the avalanche current. The avalanche current may be appropriately collected, typically by external circuitry connected to the PNI junction, and represents an output signal of the photodiode 13. The presence of the first epitaxial layer 6 guarantees a good absorption of the photons also underneath the PN junction formed by the anode region 12 and by the second epitaxial layer 8. Moreover, since the anode region 12 has a particularly small thickness, the photodiode 13 has a high sensitivity in regard to radiation having a short wavelength, given that the junction is very close to the top surface $S_{sup}$, and ultraviolet radiation has a low capacity of penetration into the semiconductor body 2.

As regards the guard ring 16, it forms a PN diode with the second epitaxial layer 8 for preventing edge breakdown of the anode region 12.

Once again with reference to FIG. 1, the semiconductor device 1 further comprises a bottom conductive region 18, which extends in contact with the semiconductor body 2, underneath the bottom surface $S_{inf}$, and is made, for example, of nickel silicide (Ni$_2$Si). The bottom conductive region 18 forms an ohmic contact with the semiconductor body 2.

The semiconductor device 1 further comprises a bottom metallization 20, arranged underneath the bottom conductive region 18 and in direct contact with the latter. For example, the bottom metallization 20 is formed by a multilayer structure including three layers arranged in succession and formed, respectively, by titanium, nickel and gold, and designated, respectively, by 21, 22, and 23.

The photodiode 13, and thus also the semiconductor device 1, further comprises a first dielectric region 26 and a second dielectric region 28, referred to hereinafter as the first and second photodiode dielectric regions 26, 28, respectively.

The first photodiode dielectric region 26 extends over the top surface $S_{sup}$ for overlying a portion of the second epitaxial layer 8 that surrounds laterally, and in direct contact, the guard ring 16, a peripheral portion of said guard ring 16 being in contact with the first photodiode dielectric region 26.

The second photodiode dielectric region 28 is separated from the first photodiode dielectric region 26 and extends over the top surface $S_{sup}$ for overlying a first portion of the anode region 12. The second photodiode dielectric region 28 is thus surrounded laterally by the first photodiode dielectric region 26, which has a closed shape. Furthermore, the second dielectric region 28 is laterally staggered with respect to the first dielectric region 26 for defining, together with the first dielectric region 26, a window 30 that gives out onto an internal portion of the guard ring 16 and onto a second portion of the anode region 12, arranged on the outside of the aforementioned first portion of the anode region 12.

The photodiode 13 further comprises a resistive region 32, which is made, for example, of polysilicon doped with boron.

The resistive region 32 extends within the window 30 for contacting the guard ring 16 and the anode region 12. Without any loss of generality, in top plan view, the resistive region 32 may be C-shaped, as illustrated qualitatively in FIG. 2, where the position of the anode region 12 is represented with a dashed line.

In addition, the resistive region 32 is delimited at the top by a surface $S_r$, referred to hereinafter as the intermediate surface $S_r$; moreover, the resistive region 32 overlies, in direct contact, portions of the first and second photodiode dielectric regions 26, 28 that give out onto the window 30. The resistive region 32 is thus arranged for overlying, in direct contact, a portion of the perimeter of the anode region 12.

Once again with reference to FIG. 1, the semiconductor device 1 further comprises a region 34, referred to hereinafter as the contact region 34.

The contact region 34 is made, for example, of polysilicon doped with boron and has a doping level higher than the doping level of the resistive region 32. Furthermore, the contact region 34 extends within a peripheral portion of the resistive region 32, starting from the intermediate surface $S_r$. Without any loss of generality, the peripheral portion of the resistive region 32 is arranged on the outside of an internal portion of the resistive region 32, which extends within the aforementioned window 30. Moreover, the contact region 34 is located, for example, at an end of the C-shaped resistive region 32.

The semiconductor device 1 further comprises a bridge structure, which is formed by three dielectric regions, referred to hereinafter, respectively, as top dielectric region 35 and first and second bottom dielectric regions 36, 38.

In detail, the first bottom dielectric region 36 is made, for example, of TEOS oxide and extends over the top surface $S_{sup}$ for overlying, in direct contact, the anode region 12, the second photodiode dielectric region 28, and the resistive region 32. In addition, the first bottom dielectric region 36 overlies the first photodiode dielectric region 26. In particular, the first bottom dielectric region 36 contacts the portion of the first photodiode dielectric region 26 that is not overlain by the resistive region 32.

The second bottom dielectric region 38 is made, for example, of TEOS oxide and extends over the top surface $S_{sup}$ to be laterally staggered with respect to the first bottom dielectric region 36. In particular, the second bottom dielectric region 38 contacts the second epitaxial layer 8.

The first and second bottom dielectric regions 36, 38 have a same thickness of, for example, 2 µm.

The top dielectric region 35 is made, for example, of silicon nitride ($Si_3N_4$), has a thickness of, for example, 1 µm, and extends over the first and second bottom dielectric regions 36, 38, with which it is in direct contact for delimiting, together with the first and second bottom dielectric regions 36, 38, a cavity 40. The top dielectric region 35 thus forms a supporting region of a suspended type and is delimited at the top by a surface $S_{top}$, referred to hereinafter as the top surface $S_{top}$.

The semiconductor device 1 further comprises a region 42, referred to hereinafter as the sensitive region 42.

The sensitive region 42 is made, for example, of titanium and is arranged on the top surface $S_{top}$ in contact with the top dielectric region 35. In particular, the sensitive region 42 overlies the cavity 40 and has a thickness of, for example, 100 nm.

The semiconductor device 1 moreover comprises a further dielectric region 44, referred to hereinafter as the sensor dielectric region 44.

In detail, the sensor dielectric region 44 is made, for example, of TEOS oxide and is arranged on the top surface $S_{top}$ for contacting the top dielectric region 35, as well as to surround the sensitive region 42, with which it is in direct contact. The sensor dielectric region 44 in any case leaves a portion of the sensitive region 42 exposed.

The semiconductor device 1 further comprises a metallization 48, referred to hereinafter as the photodiode metallization 48.

In detail, the photodiode metallization 48 is made, for example, of aluminium and extends within a trench 50, which extends through the top dielectric region 35, starting from the top surface $S_{top}$, and through the first bottom dielectric region 36 up to the contact region 34. The photodiode metallization 48 thus extends until it comes into contact with the contact region 34. Moreover, the photodiode metallization 48 partially extends over the top surface $S_{top}$. In greater detail, even though it is not illustrated, the photodiode metallization 48 does not overlie the entire resistive region 32 but rather just the portion underlying the contact region 34.

Figure 2:
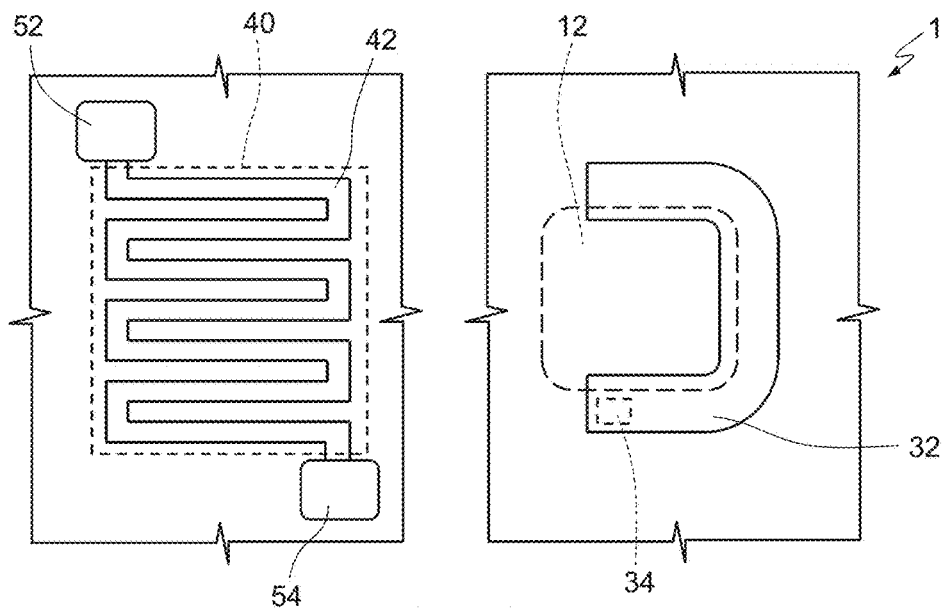
FIG. 2 is a schematic top plan view, with portions removed, of two different parts of an embodiment of the present photodiode.

Without any loss of generality, the sensitive region 42 may have a serpentine planar shape, as represented qualitatively in FIG. 2, where the position of the cavity 40 is represented with a dashed line.

As shown once again in FIG. 2, the semiconductor device 1 further comprises a first sensor metallization 52 and a second sensor metallization 54, which are made, for example, of aluminium.

In detail, the first and second sensor metallizations 52, 54 are arranged on corresponding end portions of the serpentine formed by the sensitive region 42 and in direct contact with the end portions themselves. Once again in connection with FIG. 2, this is purely qualitative and shows, for reasons of clarity, only the resistive region 32, the sensitive region 42, and the first and second sensor metallizations 52, 54, in addition to the position (represented dashed) of the cavity 40 of the anode region 12 and of the contact region 34. Furthermore, in FIG. 2 the mutual arrangement, the orientations, and the dimensions of the resistive region 32, of the contact region 34, of the serpentine formed by the sensitive region 42, and of the first and second sensor metallizations 52, 54 are purely qualitative, for reasons of clarity and of simplicity.

Figure 3:
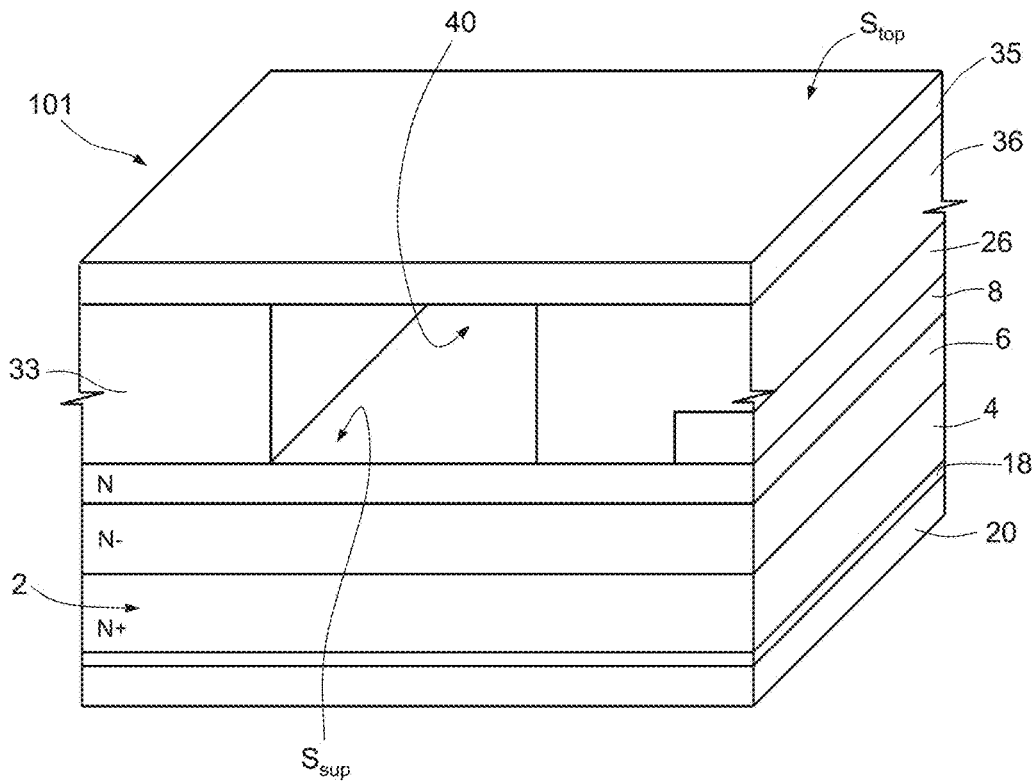
FIG. 3 is a schematic perspective view, with portions removed, of the embodiment illustrated in FIG. 1.

Once again with reference to the cavity 40, it has to a first approximation the shape of a parallelepiped that extends with a longitudinal axis parallel to the top surface $S_{sup}$. In particular, a first side wall and a second side wall of the parallelepiped, which are mutually opposite, are formed respectively by the first and second bottom dielectric regions 36, 38. A third side wall and a fourth side wall of the parallelepiped, which are mutually opposite, are formed by the second epitaxial layer 8 and by the top dielectric region 35, respectively, whereas the two bases of the parallelepiped are formed by corresponding lateral openings. As described hereinafter, these lateral openings may be closed or open, according to the embodiments. For simplicity, illustrated in FIG. 3 is just one portion of the semiconductor device 1 laterally spaced with respect to the guard ring 16, which thus does not contain, among other things, either the anode region 12 or the resistive region 32. Moreover, in FIG. 3 neither the sensitive region 42 nor the sensor dielectric region 44 are shown.

Operatively, the resistive region 32 forms a quenching resistor of the photodiode 13, through which the avalanche current flows before being collected by the photodiode metallization 48. In this connection, the anode and cathode terminals of the photodiode 13 are formed by the photodiode metallization 48 and by the bottom metallization 20, respectively.

In greater detail, the quenching resistor enables quenching of the avalanche current generated within the photodiode 13, arresting the avalanche-ionisation process, and in particular lowering, for a period of time known as "hold-off time", the effective voltage $V_e$ across the junction. Following upon quenching of the avalanche current, it is possible to restore the initial conditions of biasing of the PNI junction so that the photodiode 13 is once again able to detect photons.

The sensitive region 42, the first and second sensor metallizations 52, 54, and the aforementioned bridge structure form an IR sensor 33, referred to hereinafter as the infrared sensor 33.

In detail, the sensitive region 42 forms a membrane sensitive to absorption of infrared radiation. This membrane thus forms a resistor, the resistance of which varies as a function of the flow of infrared radiation that impinges thereon. In fact, absorption of infrared radiation causes heating of the sensitive region 42 and thus a variation of resistance. In this connection, the sensitive region 42 may be made, rather than of titanium, of other materials (for example, amorphous silicon, vanadium oxides, nickel, copper, or platinum) that have temperature coefficients (i.e., coefficients that indicate the amount of variation of resistivity as a function of temperature) higher than that of titanium; however, titanium may currently be integrated in microelectronic structures at very low costs.

In other words, the infrared sensor 33 forms a sort of MEMS microbolometer. Furthermore, the aforementioned bridge structure provides thermal insulation of the sensitive region 42 from the remaining portions of the semiconductor device 1, without it being necessary to resort to cooling systems, since the sensitive region 42 is insulated from the substrate 4. In practice, as described in greater detail hereinafter, between the first and second sensor metallizations 52, 54 an electrical signal is available that indicates the flow of infrared light that impinges upon the semiconductor device 1, which thus forms a combined ultraviolet-infrared detector of an integrated type, which may be used as flame sensor.

Figure 4:
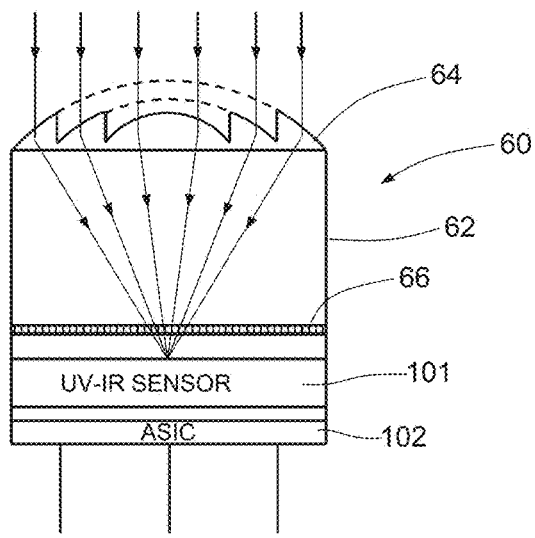
FIG. 4 is a schematic cross-sectional view of a package.

As illustrated in FIG. 4, the semiconductor device 4 may be encapsulated in a corresponding package 60, for example, of the so-called Transistor Outline (TO) type.

The package 60 includes a supporting structure 62 and a Fresnel lens 64, which is fixed to the supporting structure 62.

In detail, the first die 101, and thus the photodiode 13 and the infrared sensor 33, is arranged within the supporting structure 62, with respect to which it is fixed. In particular, the first die 101 is arranged within the supporting structure 62 to be overlain by the Fresnel lens 64, with the top surface $S_{top}$ facing the Fresnel lens 64.

Likewise, arranged within the supporting structure 62 is a second die 102, implemented in which is an application specific integrated circuit (ASIC), which is electrically connected to the first die 101 and is described hereinafter. The second die 102 is arranged underneath the first die 101.

In addition, located within the supporting structure 62 is an optical filter 66, which is arranged between the Fresnel lens 64 and the first die 101.

In greater detail, the Fresnel lens 64 is designed to increase the efficiency with which the electromagnetic radiation is collected on the semiconductor device 1. In this way, it is possible to direct towards the semiconductor device 1 radiation generated at even long distances from the semiconductor device 1.

Once again in greater detail, the Fresnel lens 64 is characterized by a reduced focal length and enables, for example, focusing on the semiconductor device 1 of radiation coming from a distance (that is to a first approximation infinite).

The optical filter 66 overlies both the photodiode 13 and the infrared sensor 33, and thus overlies both the sensitive region 42 and the anode region 12. The optical filter 66 is designed to block radiation having a wavelength comprised, for example, between 280 nm and 800 nm for blocking any possible spurious ultraviolet components, generated, for example, by arc lamps or by sunlight. Moreover, the optical filter 66 prevents visible light from impinging upon the sensitive region 42, thus preventing visible light from falsifying measurement of the infrared radiation.

Even though it is not illustrated in detail, the optical filter 66 may be formed by a Bragg grating laid on a glass substrate. The Bragg grating is formed by a plurality of pairs of layers, which are the same as one another and are arranged stacked on one another; each pair of layers comprises, for example, a layer of silicon nitride and a layer of hafnium oxide. For instance, the Bragg grating may be formed by twenty pairs of layers. Furthermore, in the spectral range from 280 nm to 800 nm the optical filter 66 has a transmittance lower than, for example, $10^{-4}$, whereas it has a high transmittance for wavelengths of less than 280 nm and higher than 800 nm so as not to attenuate infrared radiation and ultraviolet radiation.

Figure 5:
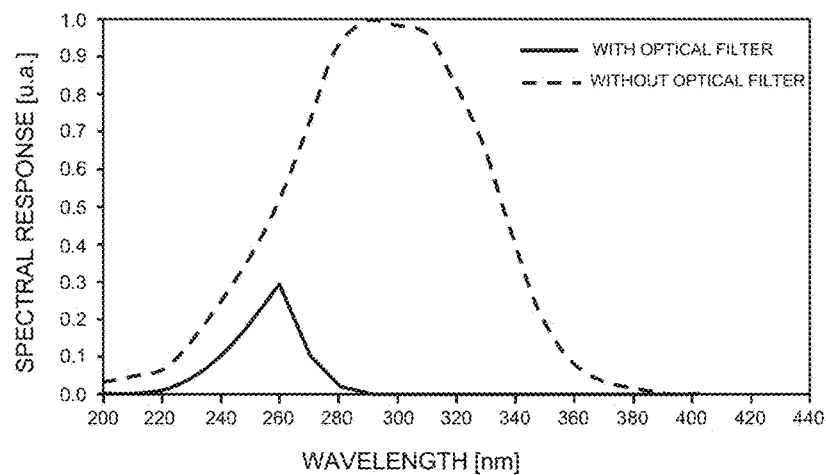
FIG. 5 shows the plots of the spectral response of a photodiode and of a photodiode coupled to an optical filter as a function of wavelength.

FIG. 5 shows examples of possible optical responses of the photodiode 13 in the presence and in the absence of the optical filter 66. It may be noted how the intrinsic optical response of a photodiode of silicon carbide has a peak at around 290 nm; the optical filter 66 enables shifting of the peak of the efficiency of detection to around 260 nm, rendering absorption above 290 nm substantially negligible.

Figure 6:
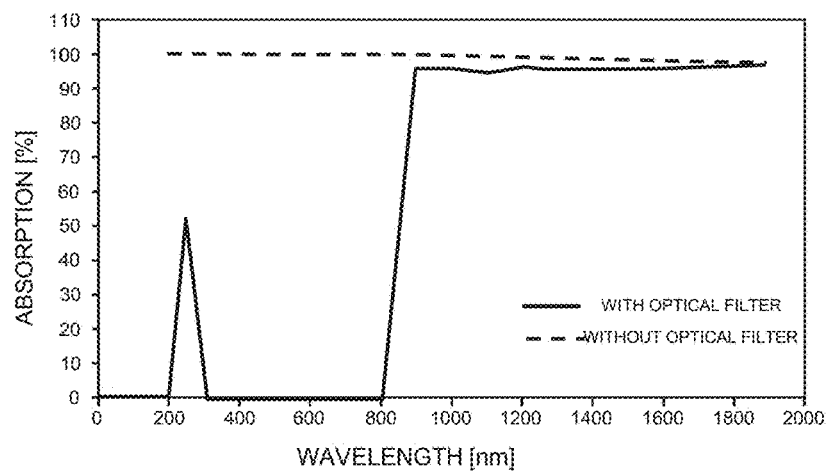
FIG. 6 shows the plots of absorption in an optically absorbing region, in the absence and in the presence, respectively, of an optical filter coupled to the optically absorbing region as a function of wavelength.

FIG. 6 shows examples of possible spectra of absorption of the infrared sensor 33, in the presence and in the absence of the optical filter 66, and on the hypothesis that the titanium sensitive region 42 has a thickness of 100 nm. It may be noted how, in the spectral range from 200 to 1900 nm, the thickness of the sensitive region 42 is sufficient for absorbing approximately 100% of radiation, in the absence of the optical filter 66; in the presence of the optical filter 66, absorption is substantially eliminated in the spectral range from 280 to 800 nm, without, however, jeopardizing, to a first approximation, absorption in the infrared.

Figure 7:
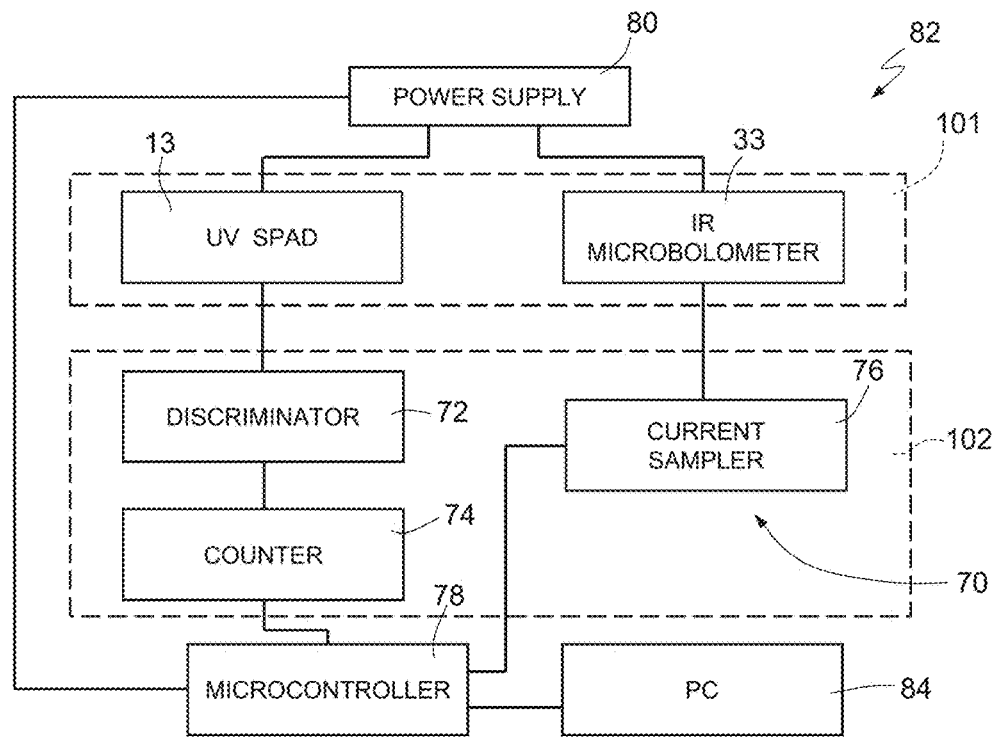
FIG. 7 shows a block diagram of a system for detecting ultraviolet and infrared radiation.

With reference to the second die 102, it implements the processing circuit 70, which is represented in FIG. 7 and comprises a discriminator 72, a counter 74, and a sampler 76.

In detail, the discriminator 72 is electrically connected to the photodiode 13 for receiving the output signal of the photodiode 13. Furthermore, if exceeding of a current threshold by an avalanche current is referred to as "event", the discriminator 72 generates a signal indicating the events; i.e., it selects only avalanche currents that have exceeded the aforementioned current threshold; in other words, the discriminator 72 generates a signal that indicates any exceeding, by the output signal of the photodiode 13, of the threshold current. For instance, the signal generated by the discriminator 72 may include a pulse whenever the output signal of the photodiode 13 exceeds the threshold current.

The counter 74 receives the signal generated by the discriminator 72 and in turn generates a signal indicating the count of the events. Albeit not illustrated, it is moreover possible for a charge integrator to be present instead of the counter 74.

The sampler 76 is connected to the infrared sensor 33 and is designed to sample a current that flows in the serpentine of the sensitive region 42, which is biased at a constant voltage, for example by a power supply 80, which is arranged on the outside of the first and second dice 101, 102 and is connected also to the photodiode 13 for biasing also the latter. In particular, if the current that flows in the sensitive region 42 is referred to as "sensor current", the sampler 76 samples the sensor current and generates a signal indicating the values sampled.

As illustrated once again in FIG. 7, the signals generated by the counter 74 and by the sampler 76 may be supplied to a microcontroller unit 78, which forms part of a sensing system 82, together with the power supply 80, to the photodiode 13, to the infrared sensor 33, and to the processing circuit 70.

In detail, the microcontroller unit 78 is able to process the signals generated by the counter 74 and by the sampler 76 for determining corresponding electrical quantities indicating the intensity of the flow of ultraviolet light and the intensity of the flow of infrared light. In particular, as regards the flow of infrared light, the microcontroller unit 78 detects possible variations of the sensor current, induced by variations of resistance of the sensitive region 42 caused by absorption of photons. Furthermore, the microcontroller unit 78 may communicate the quantities that it determines to a computer 84, which enables corresponding display thereof.

In a per se known manner, the microcontroller unit 78 may generate an alarm signal in the case where the aforementioned electrical quantities satisfy pre-set relations that indicate the presence of flames.

Figure 8:
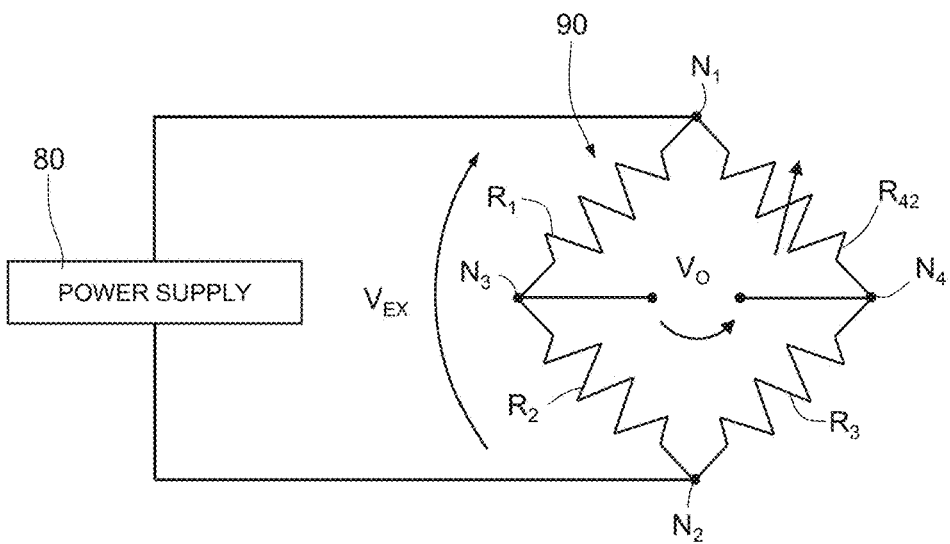
FIG. 8 shows a circuit diagram of an example of Wheatstone bridge.

In order to increase the accuracy with which possible variations of temperature of the sensitive region 42 are detected, and thus the accuracy with which the flow of infrared radiation is detected, it is possible for the sensitive region 42 to form part of a so-called Wheatstone bridge 90, an example of which is illustrated in FIG. 8.

In detail, the Wheatstone bridge 90 comprises a first resistor $R_1$, a second resistor $R_2$, and a third resistor $R_3$, which have known values of resistance, as well as the resistor formed by the sensitive region 42, designated by $R_{42}$, and referred to hereinafter as the fourth resistor $R_{42}$. Furthermore, the Wheatstone bridge 90 forms a first node $N_1$, a second node $N_2$, a third node $N_3$, and a fourth node $N_4$.

The first resistor $R_1$ is connected between the first node $N_1$ and the third node $N_3$. The second resistor $R_2$ is connected between the second node $N_2$ and the third node $N_3$. The third resistor $R_3$ is connected between the second node $N_2$ and the fourth node $N_4$. The fourth resistor $R_{42}$ is connected between the first node $N_1$ and the fourth node $N_4$.

The first and second nodes $N_1$, $N_2$ are connected, for example, to the power supply 80, which delivers a voltage $V_{EX}$. Across the third and fourth nodes $N_3$, $N_4$ a voltage $V_O$ is instead present. This having been said, the following relation applies:

$$R_{42} = \frac{(R_1(V_{EX} - V_O) - R_2 V_O)R_3}{R_1 V_O + R_2(V_{EX} + V_O)}$$

where the values of the resistances of the resistors have been designated by the references of the resistors themselves.

On the basis of the resistance of the fourth resistor $R_{42}$, it is possible to determine the temperature of the fourth resistor $R_{42}$, i.e., of the sensitive region 42, since the following relations (known as Callendar-Van Dusen equations) apply:

$R_T = R_0 \lfloor 1 + A \cdot T + B \cdot T^2 + C \cdot T^3 \cdot (T - 100° \text{ C.}) \rfloor$ for $T < 0°$ C.

$R_T = R_0 \lfloor 1 + A \cdot T + B \cdot T^2 \rfloor$ for $T > 0°$ C.;

where: T is the temperature in degrees centigrade; $R_T$ and $R_0$ are the resistances of the fourth resistor $R_{42}$, respectively at the temperature T and at 0° C.; A, B, C are the (known) Callendar-Van Dusen coefficients for the material that forms the sensitive region 42.

The first, second, and third resistors $R_1$, $R_2$, $R_3$ may be coated by corresponding layers (not illustrated) of a material (for example, gold) having a high reflectivity in regard to infrared radiation, not to undergo variations of temperature induced by absorption of infrared radiation. Furthermore, the first, second, and third resistors $R_1$, $R_2$, $R_3$ of the Wheatstone bridge 90 may be formed, for example, in the second die 102. In addition, instead of the sampler 76, a circuit designed to sample the voltage $V_o$ may be used.

Figure 9:
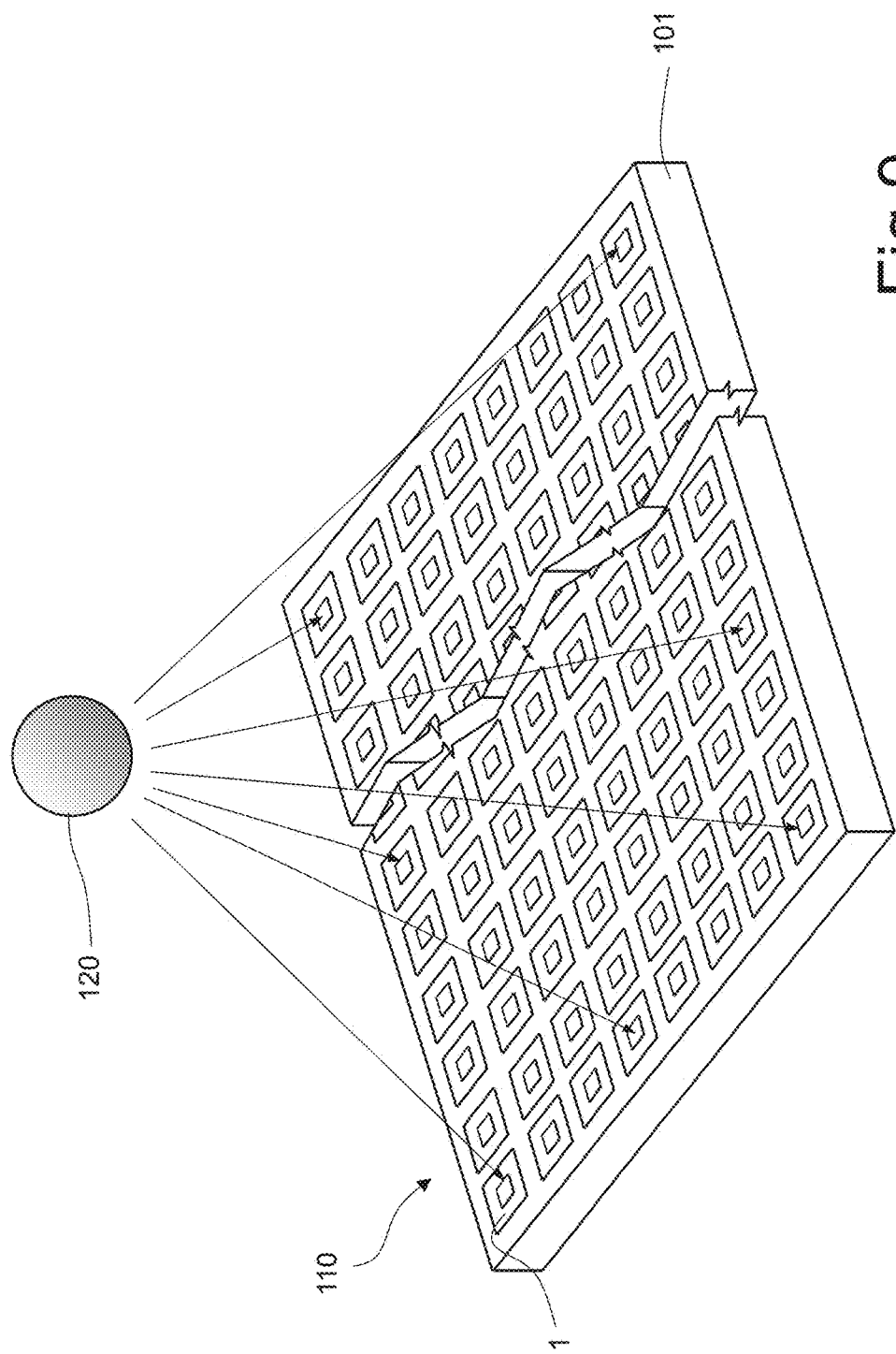
FIG. 9 is a schematic illustration of an array of semiconductor devices, optically coupled to a light source.

As illustrated in FIG. 9, the semiconductor device 1 may belong to an array 110 of semiconductor devices, which receive radiation generated by a source 120 designed to emit ultraviolet and/or infrared radiation. The array 110 may comprise, in addition to the semiconductor device 1, any number of further semiconductor devices, which are, for example, the same as the semiconductor device 1. Furthermore, the array 110 may be integrated in the first die 101.

In greater detail, the photodiodes of the semiconductor devices of the array 110 may be optically decoupled from one another. For this purpose, the PNI junction of each photodiode is surrounded by a corresponding insulation region (not illustrated) of metal material. In this way, the avalanche currents generated in one photodiode do not flow in other photodiodes. Consequently, given any one of the photodiodes, the negative effects induced by photons generated by electroluminescence during the process of avalanche multiplication in adjacent photodiodes are limited, this effect being known as "optical crosstalk".

In even greater detail, the semiconductor devices of the array 110 are arranged in rows and columns; moreover, the semiconductor devices of each row, or else of each column, may share a single corresponding cavity.

The semiconductor device of the type illustrated in FIG. 1 may be manufactured using, for example, the process described in what follows and represented in FIGS. 10-42.

Figure 10:
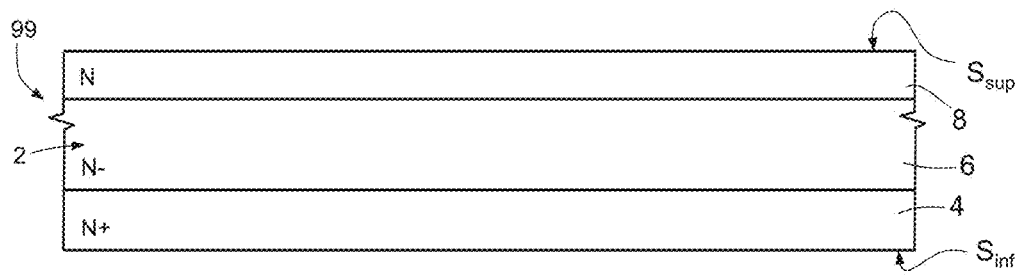
FIGS. 10-35 and 37-42 are schematic cross-sectional views of an embodiment of a semiconductor device during successive steps of a manufacturing process.

Initially, as shown in FIG. 10, the semiconductor body 2 is provided, which forms a semiconductor wafer 99 and includes the substrate 4 and the first and second epitaxial layers 6, 8. Albeit not shown or described in detail, on the semiconductor body 2 there are then formed the so-called alignment marks, in a per se known manner. For the purposes of production of the present semiconductor device 1, the details regarding formation of the alignment marks are irrelevant.

Figure 11:
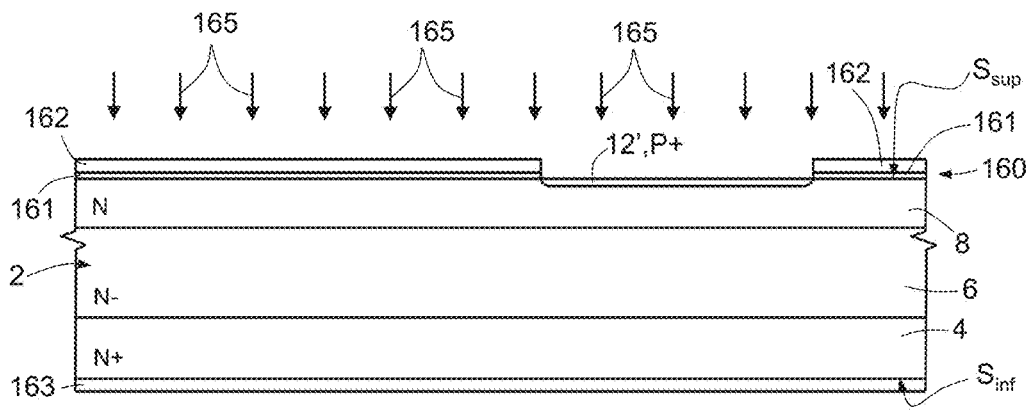

Next, as shown in FIG. 11, a process of thermal oxidation of the semiconductor body 2 is carried out, followed by a front deposition of tetraethyl orthosilicate (TEOS). In this way, formed on the top surface Ssup of the semiconductor body 2 is a first process dielectric region 160, which includes a first top dielectric layer 161, of thermal oxide and having a thickness of, for example, 40 nm, and a second top dielectric layer 162, of TEOS and having a thickness of, for example, 0.8 µm. Furthermore, present underneath the bottom surface Sinf is a first bottom dielectric layer 163, of thermal oxide.

As illustrated once again in FIG. 11, by a process of photolithography and wet etching of the first process dielectric region 160, a portion of the first process dielectric region 160 is selectively removed for exposing an underlying portion of the second epitaxial layer 8, in which the anode region 12 will be formed. In a per se known manner and consequently not illustrated in detail, selective removal of the aforementioned portion of the first process dielectric region 160 may be obtained by applying, on the first process dielectric region 160, a corresponding resist layer (not illustrated), and then carrying out a photolithographic and etching process. The resist layer is then removed. The residual portion of the first process dielectric region 160 forms a corresponding mask. Furthermore, to form the anode region 12, a process of double implantation of dopant species of a P type (for example, aluminium ions) is carried out, represented by the arrows 165, for localizing the dopant species in a first small layer 12', which gives out onto the top surface $S_{sup}$ and extends in a top portion of the second epitaxial layer 8. The double implantation is obtained, for example, with doses of $5 \cdot 10^{14}$ cm$^{-2}$ (first implant) and $1 \cdot 10^{15}$ cm$^{-2}$ (second implant), with energies of 30 keV (first implant) and 60 keV (second implant), and at a temperature of 500° C.

Figure 12:
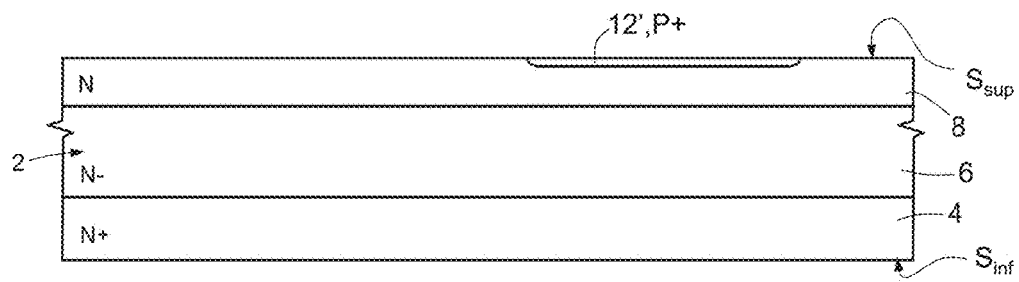

Then, as shown in FIG. 12, the first process dielectric region 160 and the first bottom dielectric layer 163 are removed by wet etching.

Figure 13:
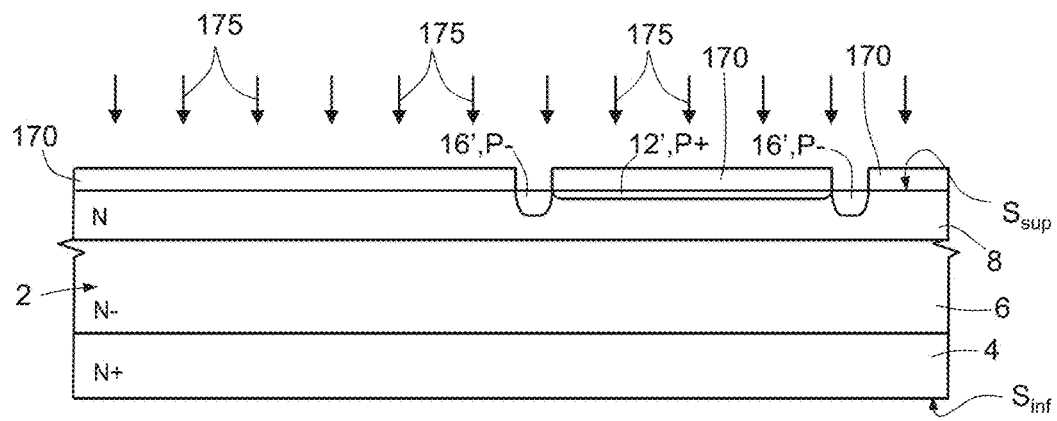

Next, as shown in FIG. 13, formed on the top surface $S_{sup}$ is a second process dielectric region 170, of TEOS and having a thickness of, for example, 0.8 µm. Then, a photolithographic and wet-etching process is carried out for removing selectively a portion of the second process dielectric region 170 in order to expose an underlying portion of the second epitaxial layer 8, in which the guard ring 16 will be formed. The residual portion of the second process dielectric region 170 forms a corresponding mask. Furthermore, to form the anode region 12, there is carried out, through the mask formed by the second process dielectric region 170, a process of multiple implantation of dopant species of a P type (for example, aluminium ions), represented by the arrows 175, for localizing the dopant species in a second small layer 16', which gives out onto the top surface $S_{sup}$ and extends in a top portion of the second epitaxial layer 8 for surrounding the first small layer 12' laterally.

In detail, the multiple implantation is carried out at approximately 500° C., with energies comprised between 120 keV and 400 keV, and with doses comprised between $1 \cdot 10^{13}$ cm$^{-2}$ and $1 \cdot 10^{14}$ cm$^{-2}$. For instance, the multiple implantation may consist of a triple implantation of aluminium with the following energies and doses: 120 keV and $3 \cdot 10^{13}$ cm$^{-2}$; 270 keV and $4 \cdot 10^{13}$ cm$^{-2}$; 400 keV and $4 \cdot 10^{13}$ cm$^{-2}$.

Figure 14:
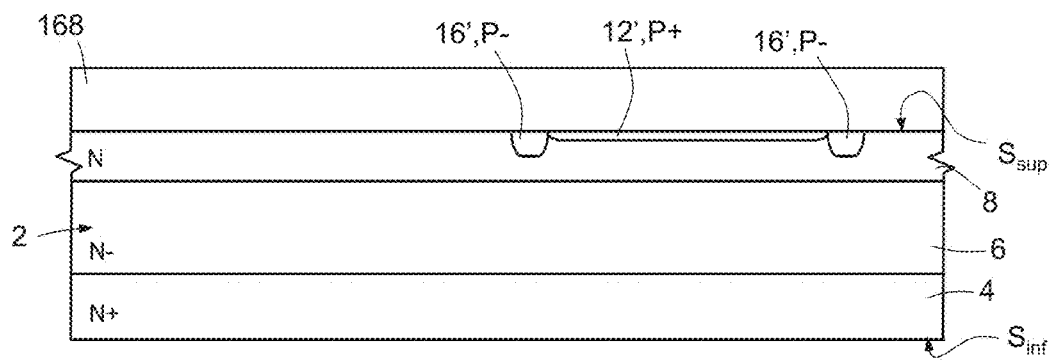

Next, the second process dielectric region 170 is removed by a wet etch. Furthermore, as shown in FIG. 14, formed on the top surface $S_{sup}$ is a polymeric layer 168 (for example, made of a resist), which has a thickness of, for example, 2.5 µm and contains carbon atoms.

Figure 15:
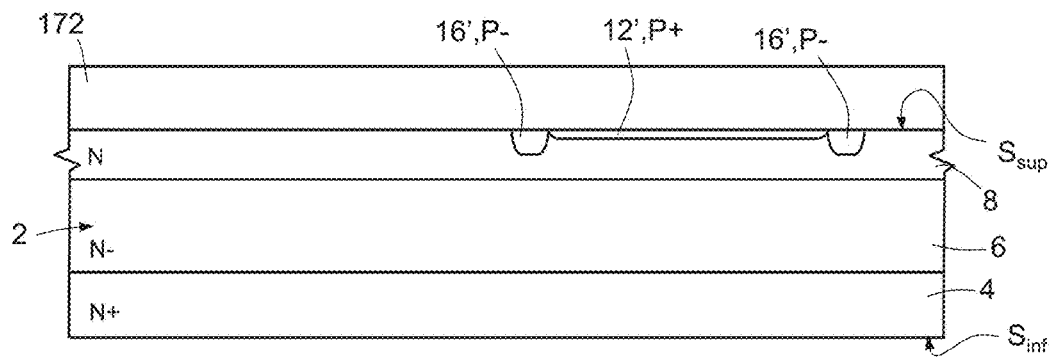

As shown in FIG. 15, the polymeric layer 168 is then subjected to a process of pyrolysis, by carrying out a thermal process at a temperature, for example, of approximately 800° C., of the duration of approximately thirty minutes and in argon environment; these operations lead to evaporation of the volatile components of the polymeric layer 168 and to consequent formation, by the carbon atoms, of a carbon layer 172.

Figure 16:
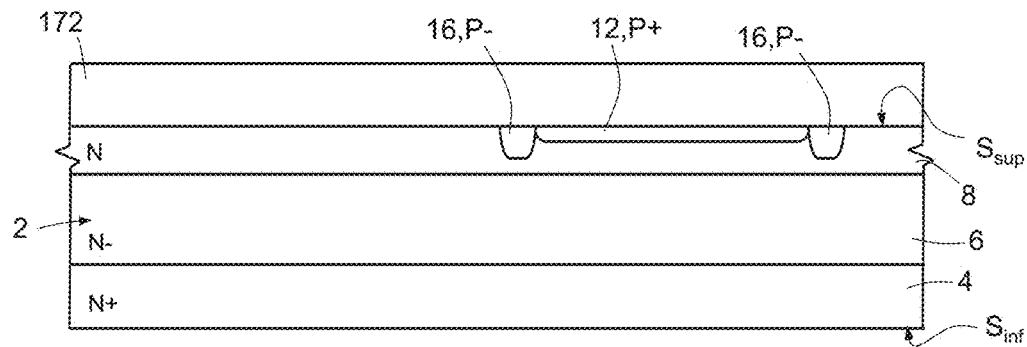

As shown in FIG. 16, a further thermal process is carried out for activating the dopant species present in the first small layer 12' and in the second small layer 16', as well as for reducing the lattice damage caused by the aforementioned double implantation. This further thermal process is carried out at a temperature, for example, of approximately 1650° C. and has a duration, for example, of approximately thirty minutes; moreover, also this further thermal process is carried out in an argon environment. Following upon execution of this further thermal process, the first and second small layers 12', 16' form the anode region 12 and the guard ring 16, respectively.

For practical purposes, the presence of the carbon layer 172 prevents formation of surface roughness of the semiconductor body 2 during execution of the aforementioned thermal process of activation of the dopant species. Moreover, the presence of the carbon layer 172 reduces diffusion outwards of the dopant species during the aforementioned thermal process.

Figure 17:
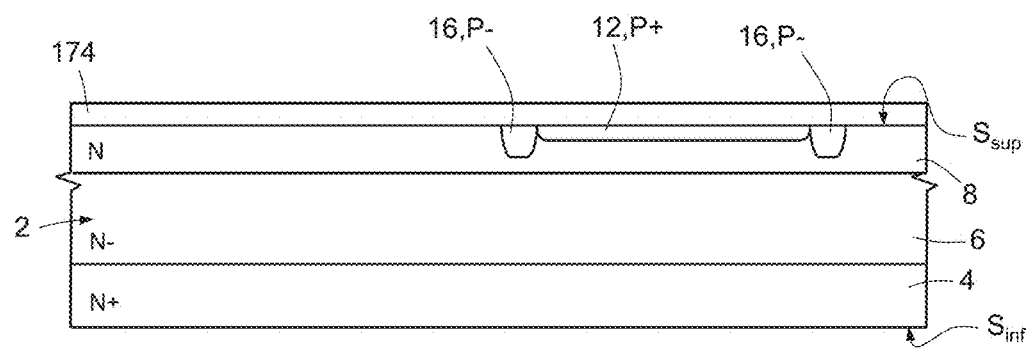

Next, as shown in FIG. 17, a further thermal process in oxygen environment is carried out at a temperature, for example, of approximately 900° C. and with a duration, for example, of approximately thirty minutes; this thermal process leads to the reaction of the carbon of the carbon layer 172 with the oxygen, and consequent generation of volatile components, which are dispersed. Consequently, formed on the top surface $S_{sup}$ is an oxidised layer 174.

Figure 18:
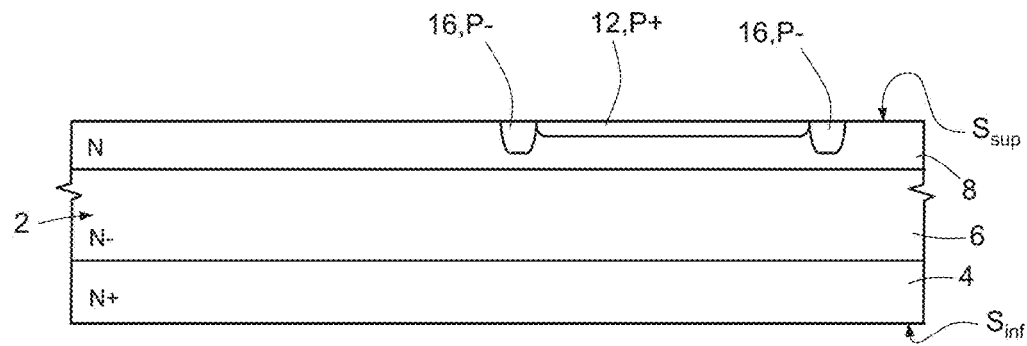

Next, as shown in FIG. 18, the oxidised layer 174 is removed, for example, by a wet etch. This wet etch also leads to removal of a first layer of thermal oxide (not illustrated) that has formed on the bottom surface $S_{inf}$ of the semiconductor body 2 during the thermal process described with reference to FIG. 17.

Figure 19:
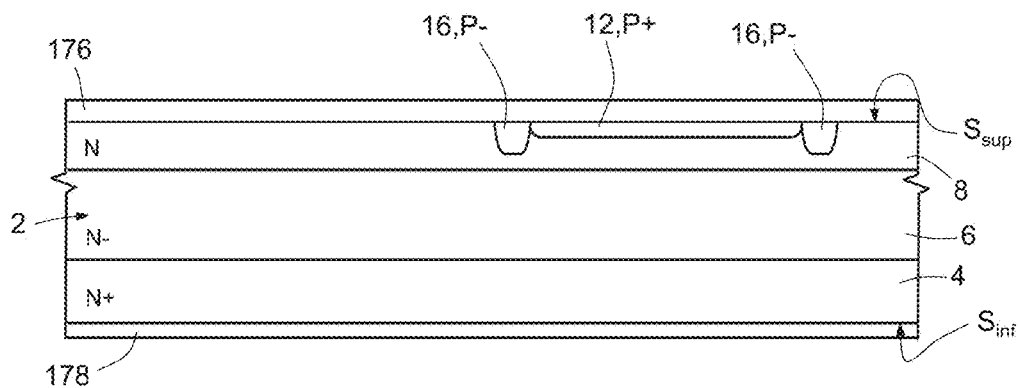

Next, as shown in FIG. 19, on the top surface $S_{sup}$ a third process dielectric region 176 is formed, for example, by deposition of a layer of TEOS having a thickness of, for example, 0.8 µm. Next, as shown once again in FIG. 19, underneath the bottom surface $S_{inf}$ a nickel layer 178 having a thickness of, for example, 200 nm is formed, for instance, by sputtering.

Figure 20:
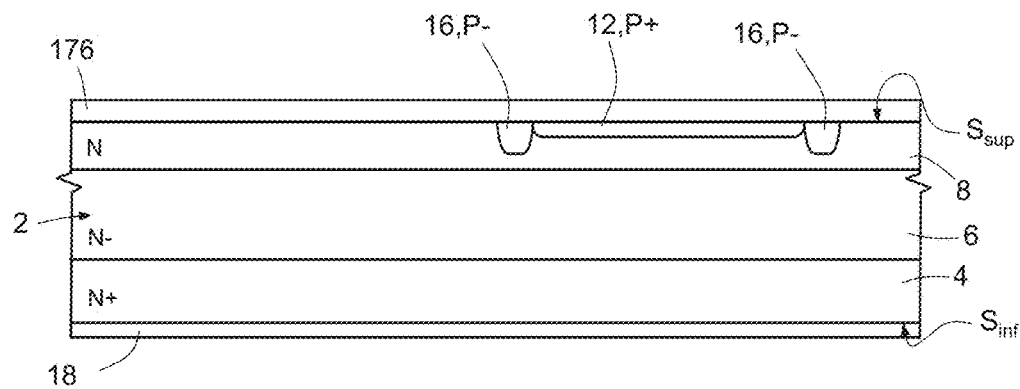

Next, as shown in FIG. 20, a silicidation process is carried out, which envisages a thermal treatment in a nitrogen environment, at the temperature of approximately 1000° C. and with a duration of sixty seconds, in order to form the bottom ohmic contact. At the end of this thermal treatment, present underneath the bottom surface $S_{inf}$ is the bottom conductive region 18.

Figure 21:
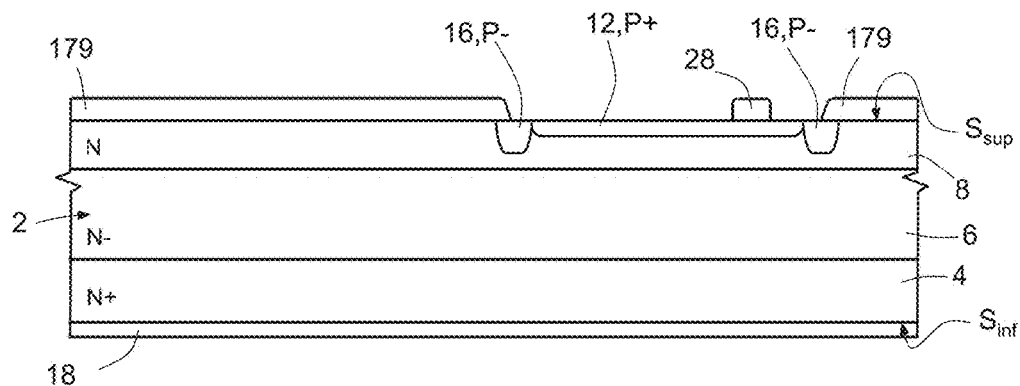

Next, as shown in FIG. 21, by a process of photolithography and subsequent wet etching portions of the third process dielectric region 176 are selectively removed. In other words, the third process dielectric region 176 functions as field-oxide region, which is patterned.

In particular, the active area of the photodiode 13, i.e., the anode region 12 and an internal portion of the guard ring 16, is exposed. Furthermore, the remaining portions of the third process dielectric region 176 form the second photodiode dielectric region 28 and a dielectric region 179, referred to hereinafter as the fourth process dielectric region 179. The fourth process dielectric region 179 is to form the first photodiode dielectric region 26 and extends, in top plan view, around the guard ring 16, being arranged on top of a peripheral portion of the latter.

Figure 22:
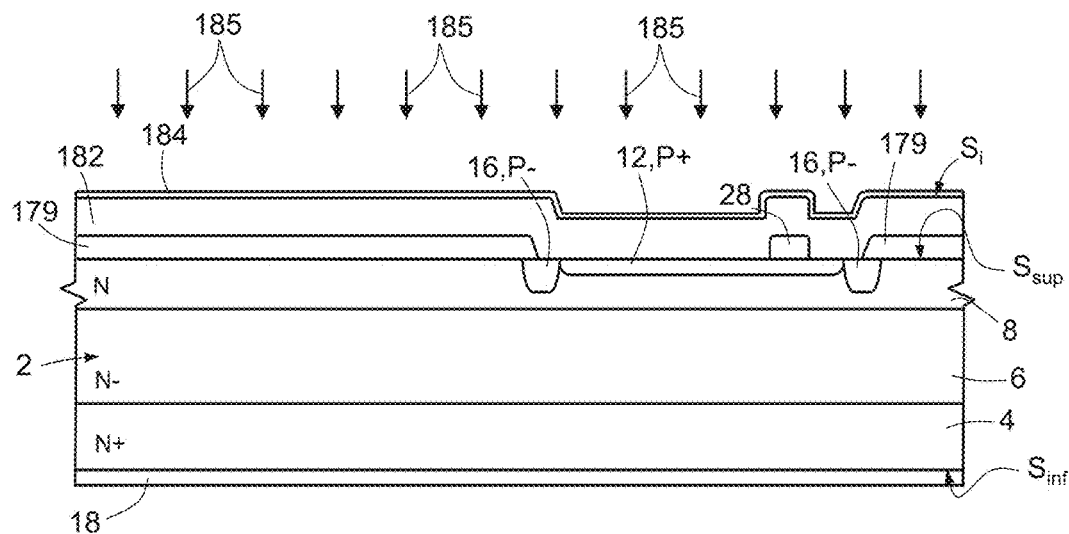

Next, as shown in FIG. 22, deposited on the top surface $S_{sup}$, on the second photodiode dielectric region 28, and on the fourth process dielectric region 179 is a layer 182, referred to hereinafter as the first process layer 182.

The first process layer 182 is made of non-doped polysilicon and has a thickness of, for example, 500 nm. The first process layer 182 is delimited by a surface $S_i$, referred to hereinafter as the process surface $S_i$. A portion of the process surface $S_i$ is to form the intermediate surface $S_r$.

As illustrated once again in FIG. 22, formed by thermal growth on the first process layer 182 is a second process layer 184. In particular, the second process layer 184 is obtained by a thermal process in oxygen environment, at a temperature of approximately 920° C. and with a duration of approximately ten minutes. The second process layer 184 has a thickness of approximately 50 nm and functions as pre-implantation oxide.

As illustrated once again in FIG. 22, there is then carried out an implantation of boron (indicated by the arrows 185) with an energy of 50 keV and a dose of $1 \cdot 10^{14}$ cm$^{-2}$. In this way, the resistivity of the first process layer 182, a portion of which will form the resistive region 32, is regulated.

Figure 23:
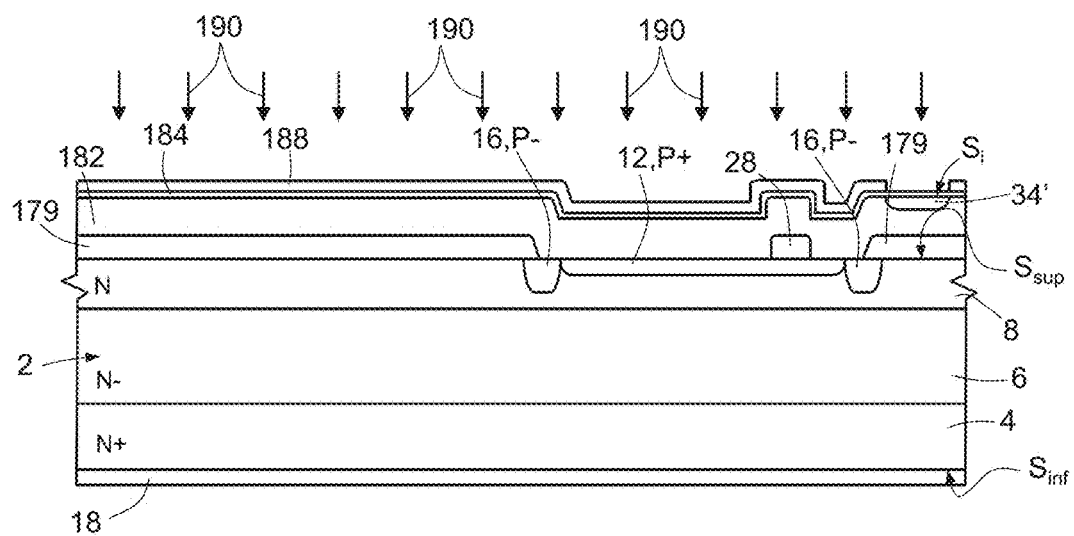

Next, as shown in FIG. 23, formed on the second process layer 184 is a mask 188, made of resist. Then, through the mask 188 there is carried out a further implantation of boron (indicated by the arrows 190) with an energy of 50 keV and a dose of $4 \cdot 10^{14}$ cm$^{-2}$ for localizing the dopant species in a third small layer 34', which extends in the first process layer 182, starting from the process surface $S_i$, and is to form the contact region 34.

Figure 24:
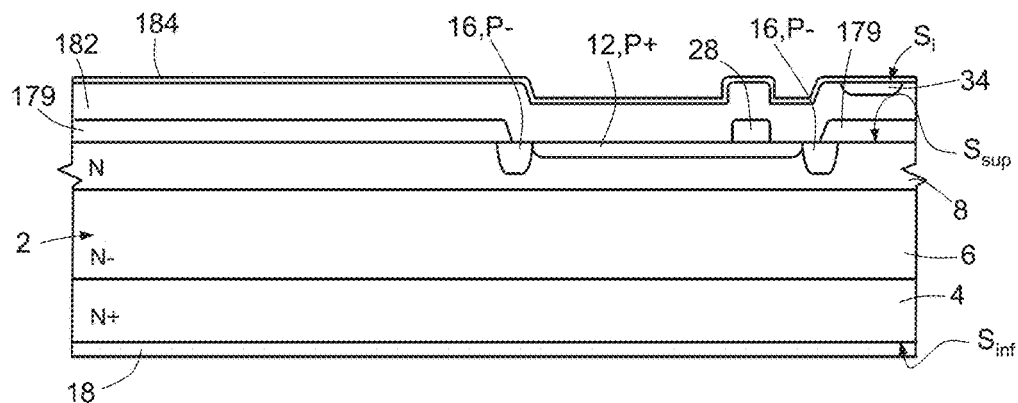

Next, as shown in FIG. 24, the mask 188 is removed and then a further thermal process is carried out to activate the dopant species present in the third small layer 34'. In particular, this thermal treatment is carried out in a nitrogen environment at a temperature of approximately 1000° C. and lasts approximately two hours. At the end of the thermal treatment, the third small layer 34' forms the contact region 34.

Figure 25:
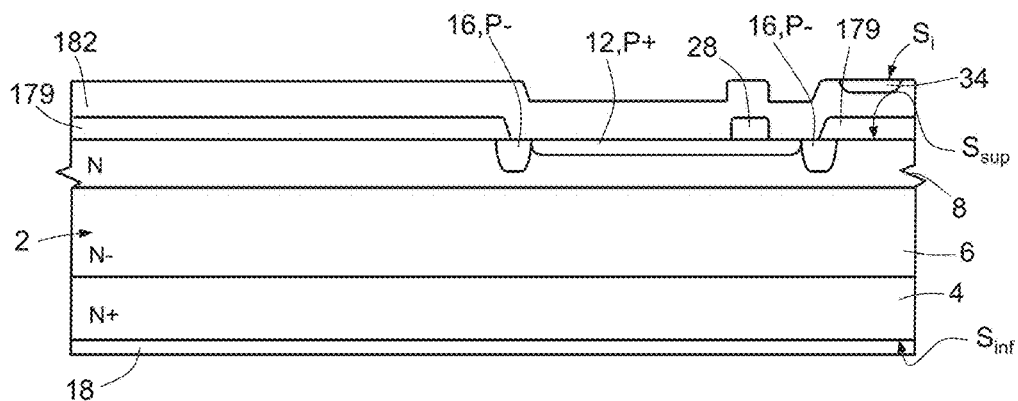

Next, as shown in FIG. 25, the second process layer 184 is removed by wet etching for exposing the first process layer 182.

Figure 26:
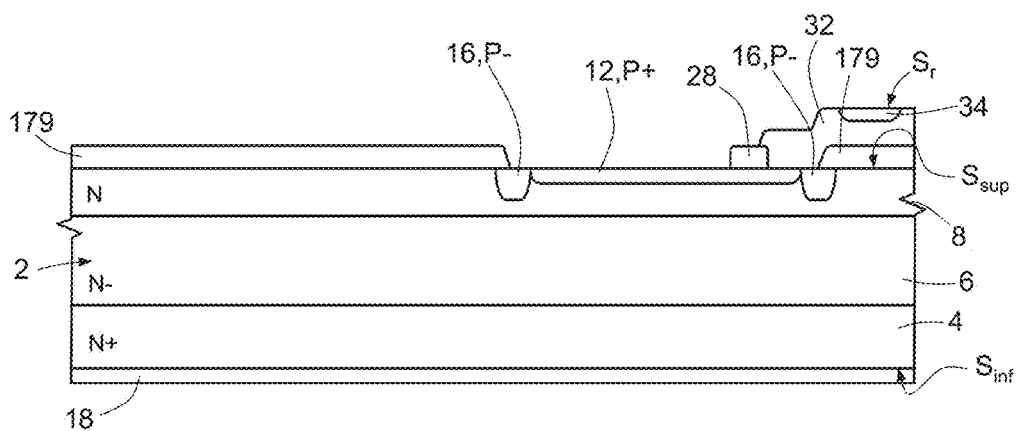

Next, as shown in FIG. 26, a portion of the first process layer 182 is removed by a photolithographic and plasma-etching process so that the residual portion of the first process layer 182 forms the resistive region 32. In this connection, without any loss of generality and purely by way of example, in FIG. 26 the resistive region 32 has a shape different from the one illustrated in FIG. 1. The residual portion of the process surface $S_i$ forms the intermediate surface $S_r$.

Figure 27:
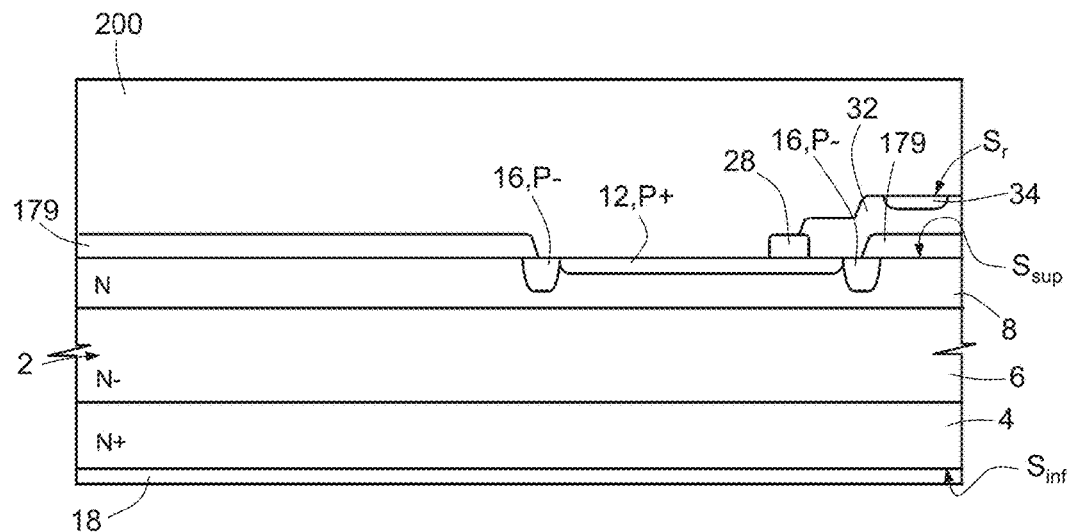

Next, as shown in FIG. 27, a fifth process dielectric region 200 is formed, for example by deposition of a layer of TEOS oxide having a thickness, for example, of 2 μm. The fifth process dielectric region 200 may be conformal, even though in FIG. 27 and in the subsequent figures it is represented, for simplicity, with a respective top surface of a planar type.

Figure 28:
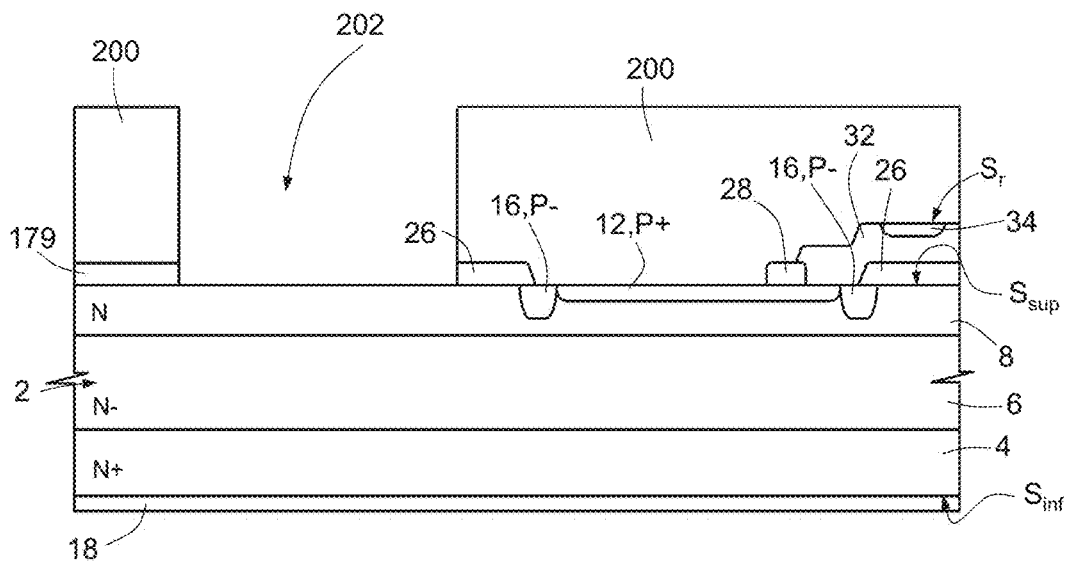

Next, as shown in FIG. 28, a portion of the fifth process dielectric region 200 and an underlying portion of the fourth process dielectric region 179 are selectively removed by a process of photolithography and subsequent plasma etching. In this way, formed within the fifth dielectric region 200 is an opening 202, onto which the second epitaxial layer 8 gives out. A first part of the remaining portion of the fourth process dielectric region 179 forms the first photodiode dielectric region 26; moreover, the opening 202 separates the first photodiode dielectric region 26 from a second part of the remaining portion of the fourth dielectric region 179.

Figure 29:
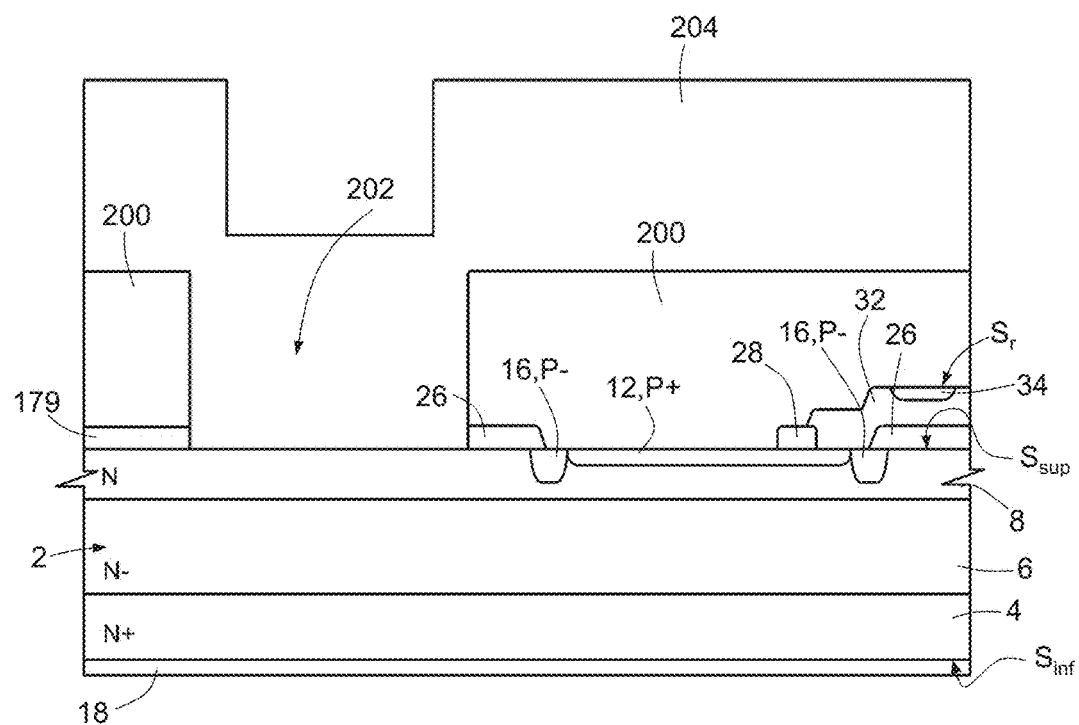

Next, as shown in FIG. 29, laid on the residual portion of the fifth dielectric region 200 and within the opening 202 is a layer 204, referred to hereinafter as the conformal layer 204.

In detail, the conformal layer 204 is made, for example, of aluminium and coats the residual portion of the fifth dielectric region 200, in addition to the walls and the bottom of the opening 202, and has, for example, a thickness greater than the thickness of the fifth dielectric region 200, so that its minimum height, reached on top of the opening 202, is greater than the maximum height of the fifth dielectric region 200.

Figure 30:
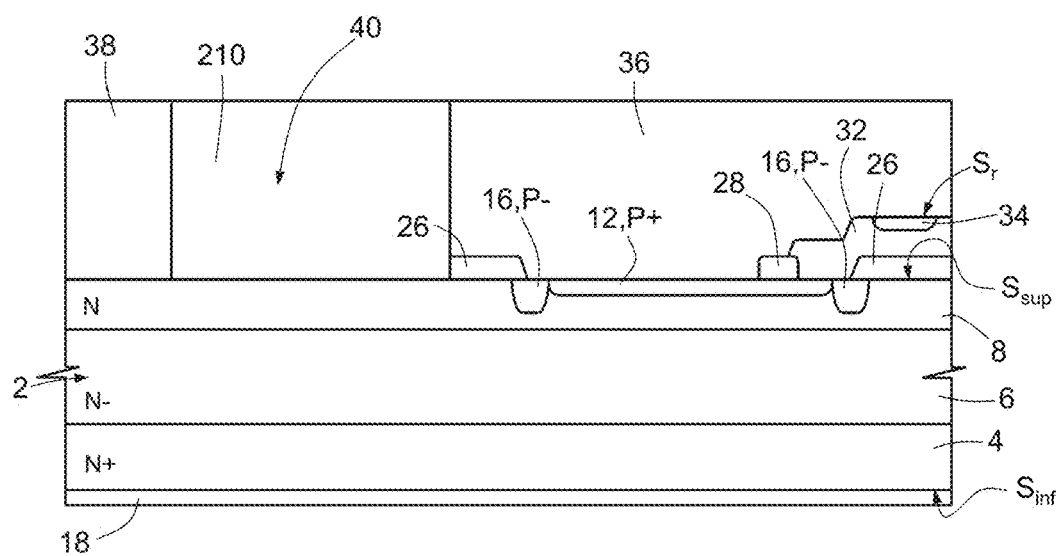

Next, as shown in FIG. 30, a planarization process using the CMP (chemico-mechanical polishing) technique is carried out, until a top portion of the residual portion of the fifth dielectric region 200 is removed, as well as a portion of the conformal layer 204. Following upon these operations, the remaining portions of the fifth dielectric region 200 form the first and second bottom dielectric regions 36, 38. Furthermore, present between the first and second bottom dielectric regions 36, 38 is the cavity 40, which is entirely filled with a residual portion (designated by 210) of the conformal layer 204, referred to hereinafter as the filling region 210. In addition, even though the first bottom dielectric region 36 also includes the aforementioned second part of the remaining portion of the fourth dielectric region 179, the latter is no longer shown, for reasons of simplicity of representation. On the other hand, the second part of the remaining portion of the fourth dielectric region 179 is not illustrated not even in FIG. 1.

Figure 31:
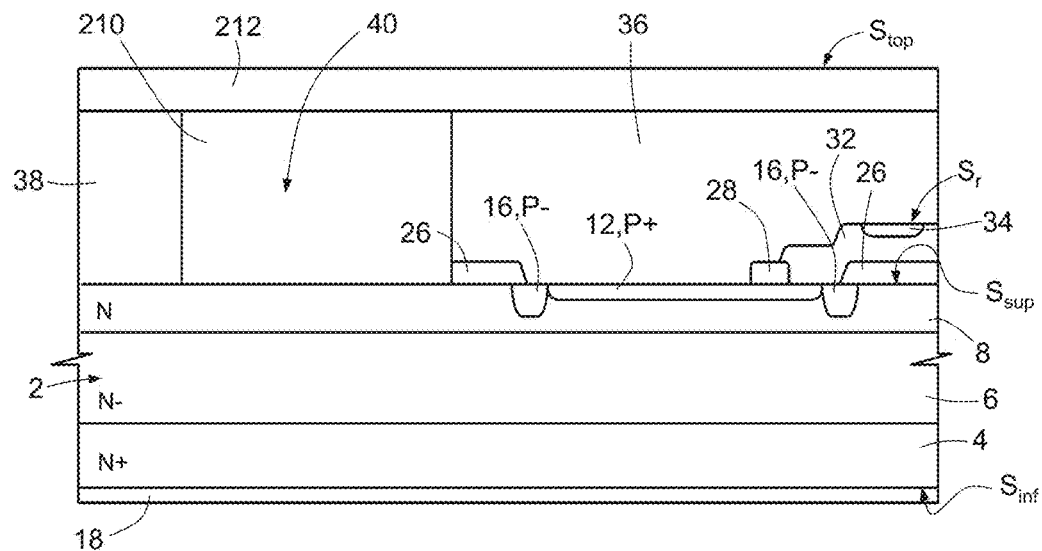

Next, as shown in FIG. 31, laid on the filling region 210 and on the first and second bottom dielectric regions 36, 38 is a third process layer 212, of silicon nitride and having a thickness of, for example, 1 μm. The third process layer 212 forms the top surface $S_{top}$. In general, for reasons that will be clarified hereinafter, the third process layer does not prevent completely access to the cavity 40, and in particular to the lateral openings of the cavity 40, on account of the non-planar top profile of the wafer 99.

Figure 32:
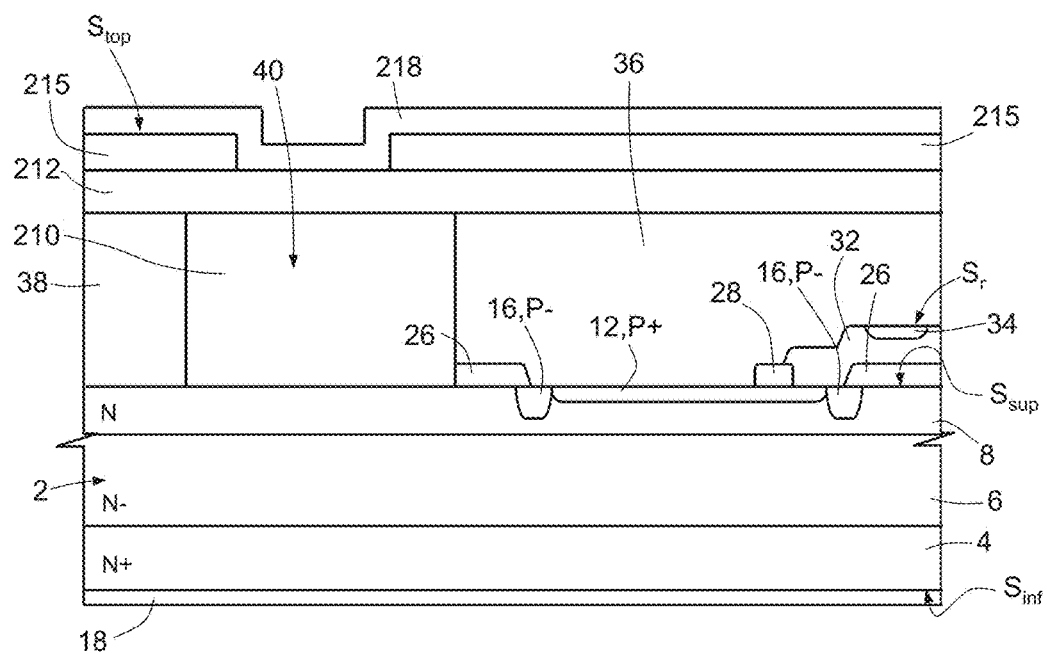

Next, as shown in FIG. 32, formed by a photolithographic process on the third process layer 212 is a resist mask 215. Furthermore, formed on the mask 215 and on the exposed portions of the third process layer 212, for example, by sputtering, is a titanium film 218 having a thickness of, for example, 100 nm.

Figure 33:
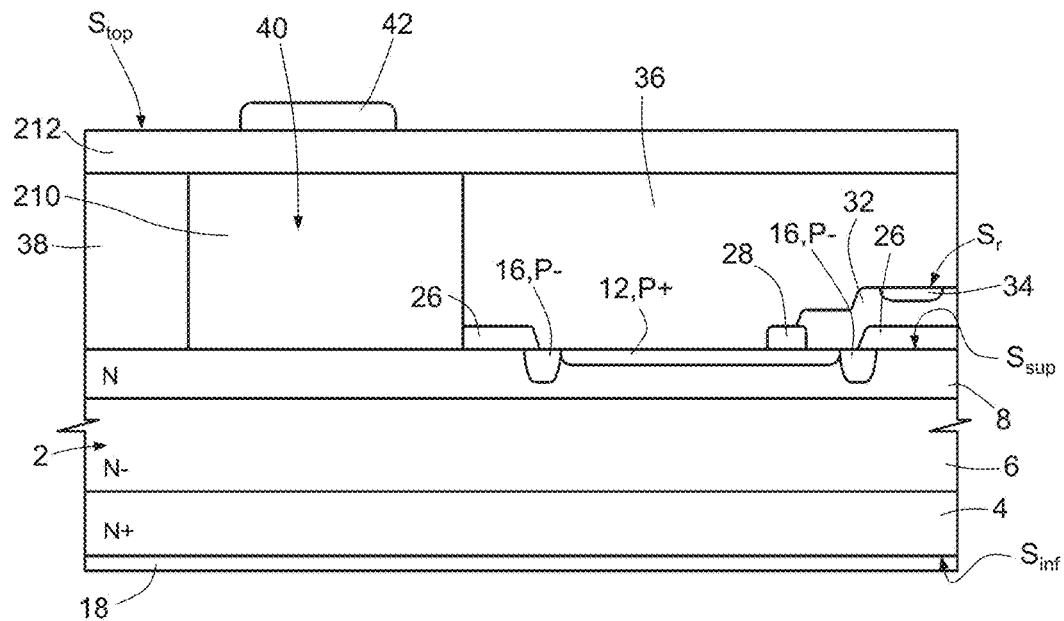

Next, as shown in FIG. 33, a lift-off process is carried out; i.e., the mask 215 and the portions of the film 218 that overlie the mask 215 are removed. The residual portion of film 218 forms the sensitive region 42.

The manufacturing process may then proceed according to two variants.

Figure 34:
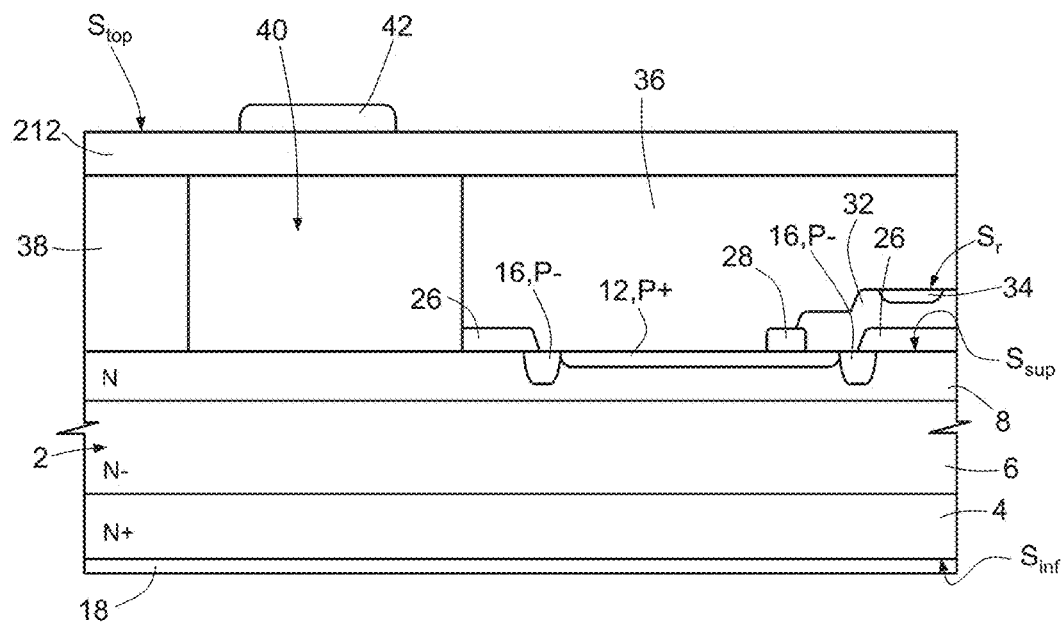

According to a first variant, a wet etch is carried out for removing the filling region 210, as shown in FIG. 34. In this connection, the filling region 210 is etched starting from the aforementioned lateral openings of the cavity 40, which, as mentioned previously, are accessible notwithstanding the presence of the third process layer 212. In this connection, in order to facilitate chemical removal of the filling region 210, it is possible for the wet etch carried out for removing the filling region 210 to be preceded by lateral etching of a dry type, designed to remove selectively portions of the third process layer 212.

Figure 35:
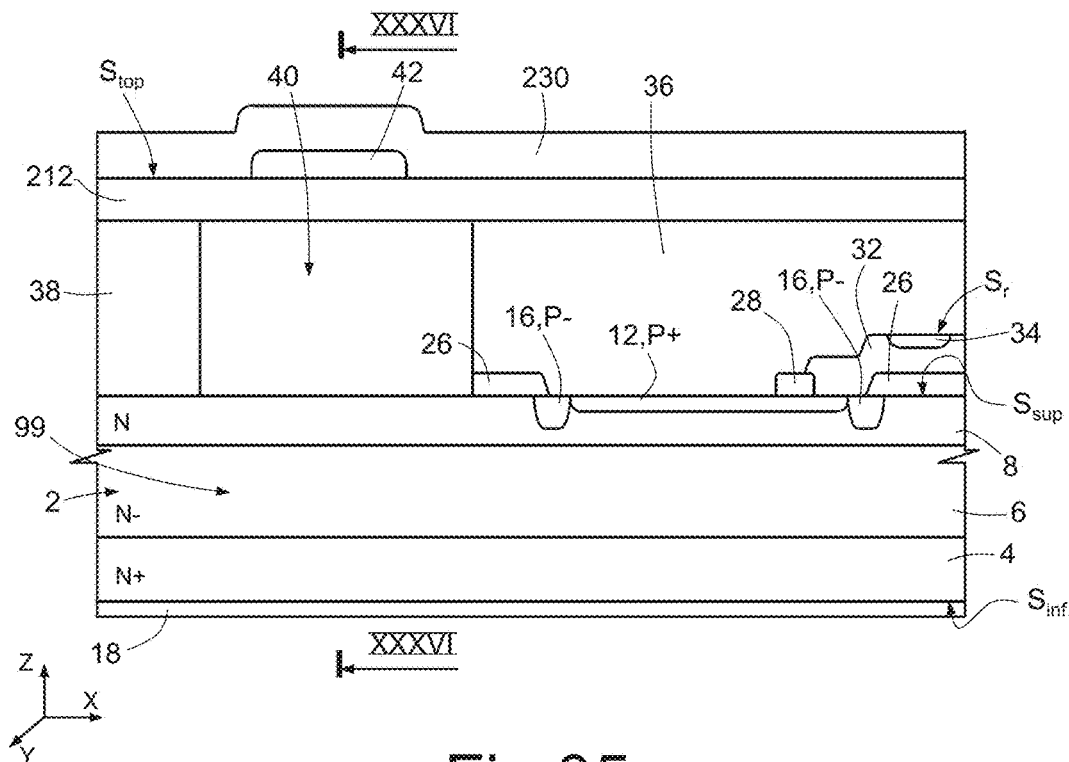

Next, as shown in FIG. 35, a coating layer 230 is formed on top of the wafer 99.

Figure 36:
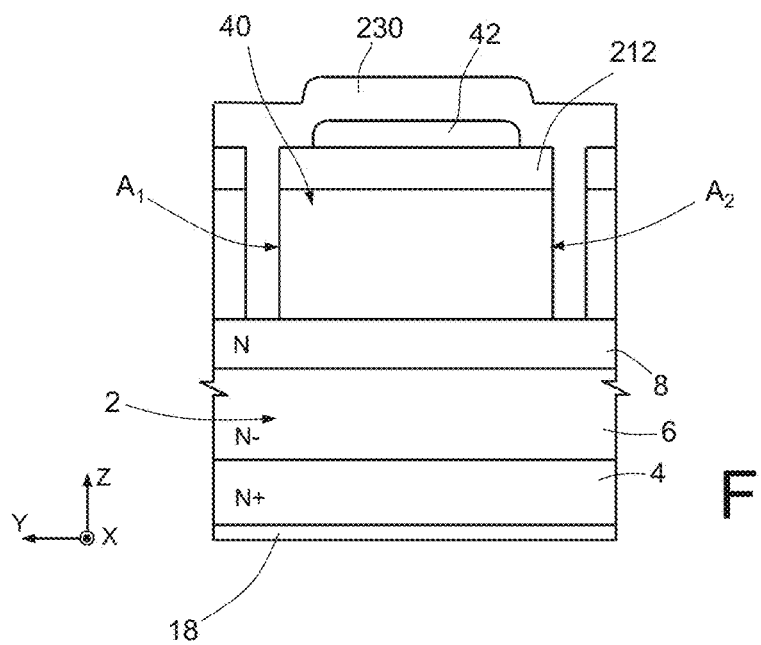
FIG. 36 shows a different cross-sectional view of an embodiment during the same step of the manufacturing process as that of FIG. 35.

In detail, the coating layer 230 is made of dielectric material (for example, TEOS oxide, or else silicon nitride), has a thickness, for example, equal to or greater than 1.6 μm, and is formed to be substantially uniform and to close the aforementioned lateral openings of the cavity 40, as illustrated schematically in FIG. 36, where the lateral openings of the cavity 40 are designated by $A_1$ and $A_2$, respectively. In order to facilitate understanding of the orientation of the cross-sections illustrated in FIGS. 35 and 36, these figures also present an orthogonal reference system xyz. Furthermore, in FIG. 36 it is assumed that the aforementioned lateral etch has been carried out previously.

Figure 37:
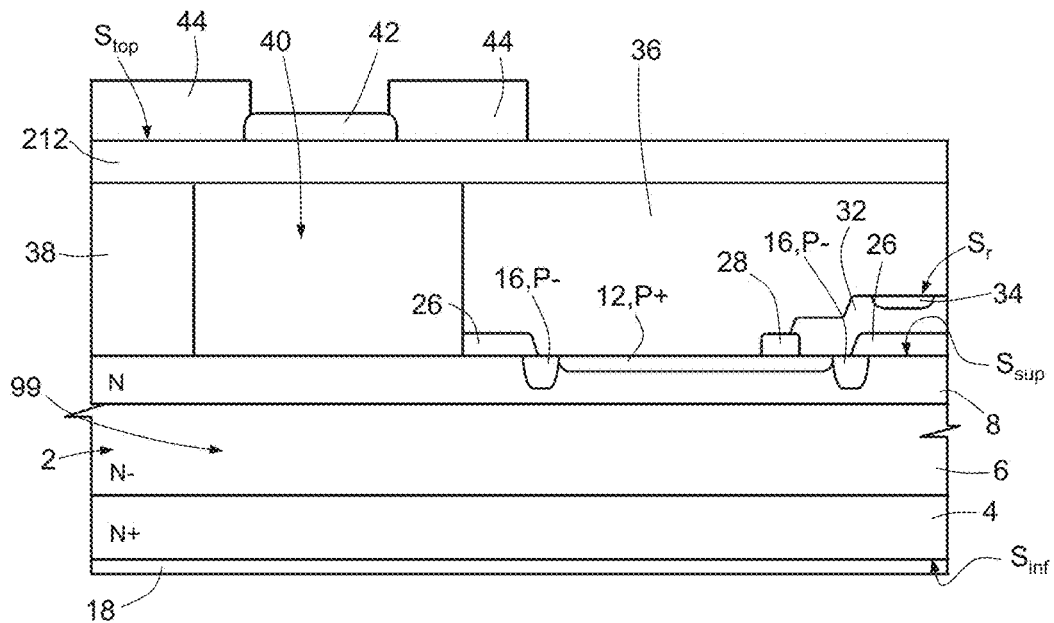

Next, as shown in FIG. 37, a portion of the coating layer 230 arranged in contact with the top surface $S_{top}$ is removed for exposing an underlying portion of the third process layer 212. Simultaneously, also a portion of the coating layer 230 arranged on the sensitive region 42 is removed in order to expose the sensitive region 42. For instance, removal of these portions of the coating layer 230 may be obtained by carrying out a process of photolithography and subsequent wet etching. The portions of the coating layer 230 that have remained form the sensor dielectric region 44. In addition, the portions of the coating layer 230 that have remained continue to close the lateral openings $A_1$, $A_2$ of the cavity 40, which will remain closed also after the manufacturing process is terminated.

Figure 38:
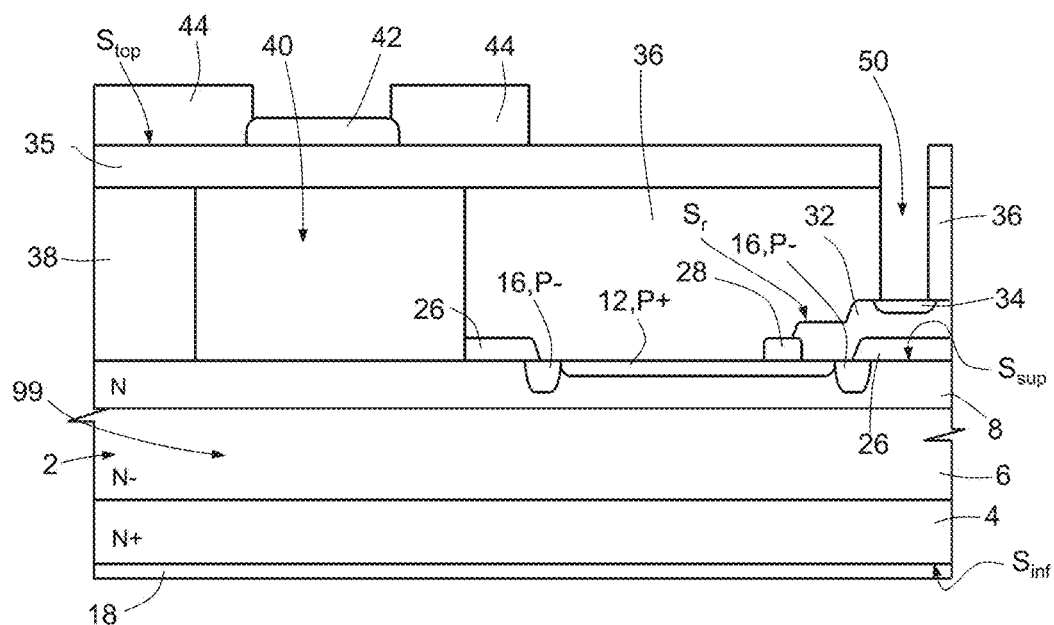

Next, as shown in FIG. 38, dry etching is carried out using a corresponding mask (not illustrated) in order to form the trench 50 by selective removal of the exposed portion of the third process layer 212 and of an underlying portion of the first bottom dielectric region 36. The remaining portion of the third process layer 212 forms the top dielectric region 35.

Next, in a way not illustrated, the photodiode metallization 48 and the first and second sensor metallizations 52, 54 are formed by deposition of a conformal layer of aluminium, which has a thickness of, for example, 3.2 µm and extends, among other things, in the trench 50 and in contact with the sensitive region 42; the part of aluminium in excess, i.e., the part that does not form the aforementioned metallizations, is then removed in a per se known manner. Thanks to the fact that the lateral openings $A_1$, $A_2$ of the cavity 40 are closed by the remaining portions of the coating layer 230, the aluminium does not penetrate into the cavity 40 during the steps of formation of the photodiode metallization 48 and of the first and second sensor metallizations 52, 54.

Figure 39:
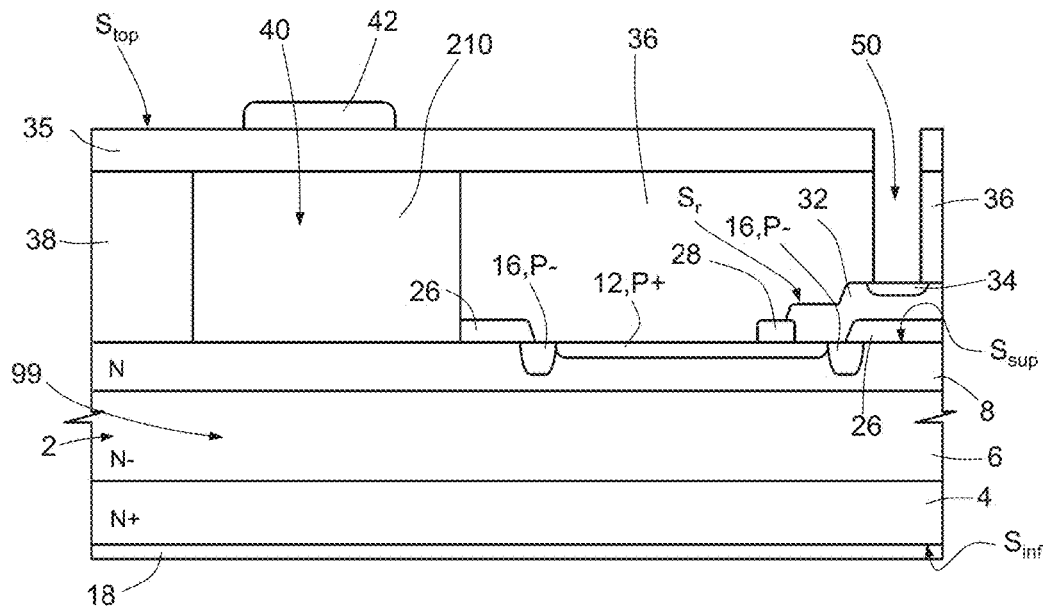

According to a second variant, following upon the operations described with reference to FIG. 33 dry etching is carried out using a corresponding mask (not illustrated) in order to form the trench 50 by selective removal of a portion of the third process layer 212 and of an underlying portion of the first bottom dielectric region 36, as shown in FIG. 39. The remaining portion of the third process layer 212 forms the top dielectric region 35.

Figure 40:
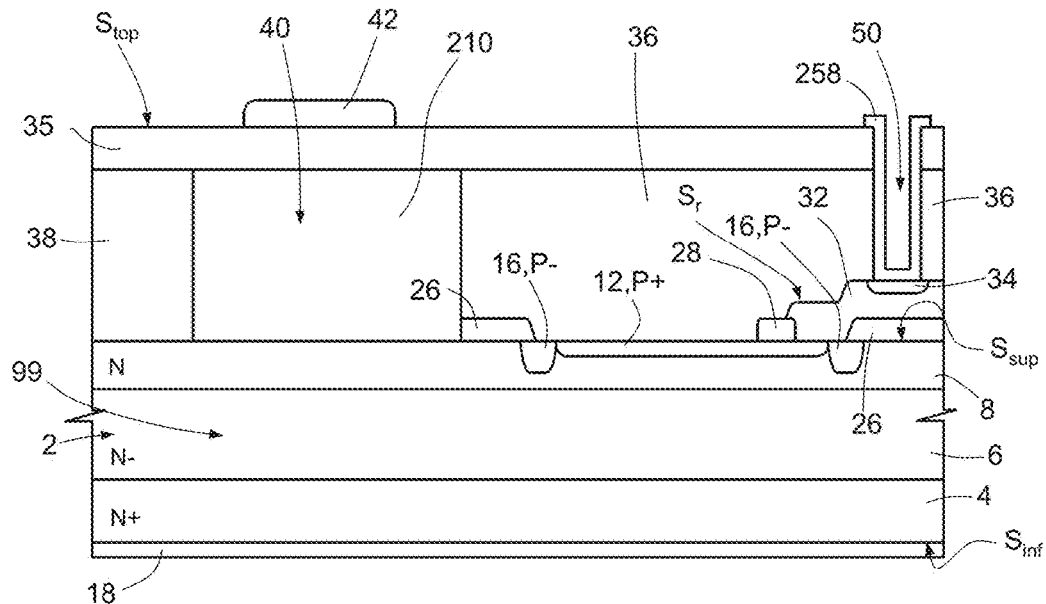
Figure 41:
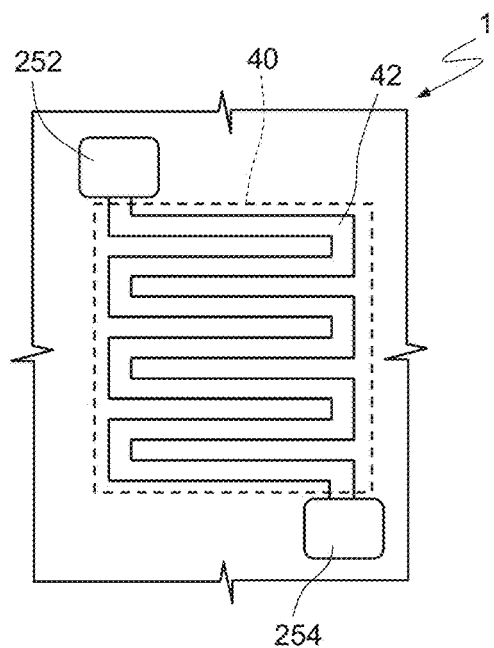

Next, as shown in FIGS. 40 and 41, the first and second sensor metallizations, designated by 252 and 254, respectively (not visible in FIG. 40) and the photodiode metallization, designated by 258, are formed.

In detail, the first and second sensor metallizations 252, 254 and the photodiode metallization 258 are made, for example, of gold, have a thickness of, for example, 0.5 µm and are obtained, for example, using a metal lift-off process (not represented in detail).

In greater detail, the photodiode metallization 258 coats the side walls and the bottom of the trench 50, whereas the first and second sensor metallizations 252, 254 overlie end portions of the sensitive region 42.

Figure 42:
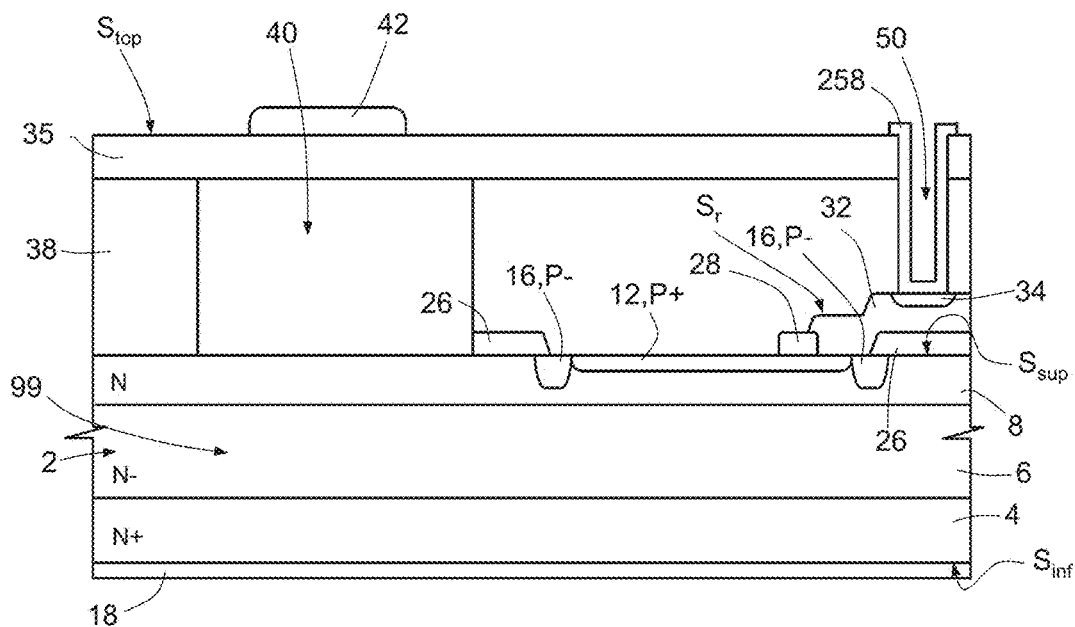

Next, as shown in FIG. 42, a wet etch is carried out in order to remove the filling region 210. This etch is performed so as not to remove the first and second sensor metallizations 252, 254 or the photodiode metallization 258 or the sensitive region 42. This is possible thanks to the fact that the first and second sensor metallizations 252, 254, the photodiode metallization 258, and the sensitive region 42 are made of metals different from the metal that forms the filling region 210, the latter metal being then etched in a selective way with respect to the other metals. As regards accessibility of the filling region 210, the considerations made in connection with FIG. 34 apply. In this way, the infrared sensor 33 is thermally insulated.

In practice, when the semiconductor device 1 is formed by implementing the second variant of the manufacturing process, the openings $A_1$, $A_2$ of the cavity 40 remain open. In addition, all the phototechnical operations are carried out on a structure that is not yet suspended thanks to the use of a first material (for example, gold) different from a second material (for example, aluminium) that forms the filling region 210 and to the selectivity with which it is possible to remove the second material.

The advantages that the present semiconductor device affords emerge clearly from the foregoing discussion. In particular, the present semiconductor device forms a combined ultraviolet and infrared monolithic sensor, which is characterized by considerable compactness, low cost, as well as by a longer service life and a lower operating voltage since it makes it possible to do without gas photomultiplier tubes.

In particular, in the case where the present semiconductor device is made of silicon carbide, it is characterized by a low dark current and by the possibility of operating at high temperatures, without undergoing significant alterations of its electrical characteristics. Furthermore, the use of an avalanche photodiode for detecting ultraviolet radiation enables an increase in sensitivity in regard to low radiation flows, as well as a reduction of the response times. The interferential filter enables, instead, reduction of the sensitivity in regard to possible spurious radiation having a wavelength comprised between 280 nm and 800 nm, with consequent reduction of the likelihood of false alarms. Moreover, the filter prevents absorption of visible radiation by the infrared detector, thus preventing occurrence of variations of temperature induced by radiation that are not relevant for the purposes of flame detection. In addition, the presence of the bridge structure renders superfluous the use of a system for cooling the infrared sensor.

From a quantitative standpoint, the photodiode 13 enables detection of ultraviolet flows of up to approximately 400 $pW/cm^2$. In addition, assuming, for example, that the serpentine of the sensitive region is made of titanium (with a resistivity of $43 \cdot 10^{-8}$ $\Omega \cdot m$), is 100 nm thick, 2 mm long, and 2 µm wide, it may be shown that the corresponding resistance is approximately 4 k$\Omega$. It may likewise be shown that a variation of temperature of $\frac{1}{10}$ of a Celsius degree around an average temperature of 100° C. of a pointlike body produces, at a distance of approximately 40 m, and on the hypothesis of black-body emission and negligible absorption in the surrounding medium, a variation of the optical power emitted of approximately 6 nW, which, when absorbed by a sensitive region with a conductance of 0.6 $\mu W/cm^2$, induces a variation of temperature of the sensitive region of $\frac{1}{100}$ of a Celsius degree. On the assumption that the sensitive region has a temperature coefficient of $3 \cdot 10^{-3}\%/°$ C., this variation in temperature leads to a variation of resistance of approximately 0.12$\Omega$ with respect to the aforementioned value of 4 k$\Omega$, this variation of resistance being itself readable with current technologies.

Finally, it is evident that modifications and variations may be made to the present semiconductor device and to the manufacturing process described herein, without thereby departing from the scope of the present disclosure.

For instance, the semiconductor body 2 may be made of a semiconductor material different from silicon carbide. Furthermore, the types of conductivity may be reversed with respect to what has been described. In this connection, however, the adoption of a structure of a P-on-N type (as in the embodiment illustrated in FIG. 1) makes it possible to benefit from the fact that the rate of ionisation in silicon carbide by impact of the holes is greater than the rate of ionisation by impact of the electrons.

Embodiments are moreover possible in which the semiconductor body comprises a third epitaxial layer (not illustrated), the function of which is to facilitate reversal of the conductivity type doping in at least one portion of the semiconductor body, which is to form the anode region. In this case, the anode region extends through the third epitaxial layer until it penetrates into a top portion of the second epitaxial layer.

As regards the first epitaxial layer 6, it may be made of intrinsic silicon carbide.

As regards the top dielectric region 35, it may be made of a dielectric material different from silicon nitride, such as TEOS oxide.

As regards the first and second sensor metallizations, they may be made of metals different from one another and/or of one or more metals different from the metal that forms the photodiode metallization. Furthermore, in the second variant of the manufacturing process, it is sufficient for the first and second sensor metallizations and the photodiode metallization to be made of metals that may be chemically etched in a selective way with respect to the metal used to form the filling region within the cavity, it being in turn possible to etch the latter metal in a selective way with respect to the material that forms the sensitive region.

As regards the contact region 34, it may be absent, in which case the manufacturing process is modified accordingly.

Moreover possible are variants in which the sensor dielectric region 44 extends over the sensitive region 42.

Finally, with reference to FIG. 28, it is possible for the opening 202 not to have a depth such as to expose the second epitaxial layer 8.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a semiconductor device for flame detection, comprising:
   in a semiconductor body of a first conductivity type, which includes a front surface and a cathode region, forming an anode region of a second conductivity type, which extends within said semiconductor body, starting from the front surface, and forms, together with the cathode region, a junction of a photodiode configured to detect ultraviolet radiation emitted by flames;
   forming a supporting dielectric region on the semiconductor body; and
   forming, on the supporting dielectric region, a sensitive region having a resistance configured to vary as a function of the infrared radiation emitted by the flames.

2. The manufacturing process according to claim 1, further comprising forming, in contact with the semiconductor body, a bridge dielectric structure including the supporting dielectric region and delimiting a cavity arranged on the semiconductor body.

3. The manufacturing process according to claim 2, further comprising:
   forming, on the front surface, a first dielectric layer;
   forming, within the first dielectric layer, an opening;
   forming, in the opening, a filling region of a first metal material;
   forming a second dielectric layer on the filling region and the first dielectric layer, the filling region being accessible laterally through a pair of lateral openings; and
   removing the filling region to form a cavity directly under the sensitive region.

4. The manufacturing process according to claim 3, further comprising, after removing the filling region:
   forming a coating of dielectric material on the sensitive region and the second dielectric layer, so that said coating closes the lateral openings of the cavity;
   selectively removing a first portion of the coating arranged in contact with the second dielectric layer and a second portion of the coating arranged in contact with the sensitive region;
   selectively removing an exposed portion of the second dielectric layer and an underlying portion of the first dielectric layer so as to form a trench;
   forming a pair of sensor metallizations in contact with the sensitive region; and
   forming in the trench a photodiode metallization.

5. The manufacturing process according to claim 3, further comprising:
   forming a trench through the first and second dielectric layers;
   forming, in contact with the sensitive region, a pair of sensor metallizations of a second metal material, different from the first metal material;
   forming in the trench a photodiode metallization of a third metal material, different from the first metal material; and subsequently:
   selectively removing the filling region by a wet etch.

6. The manufacturing process according to claim 5, wherein the third metal material is the same as the second metal material; and the sensitive region is made of a material different from the first metal material.

7. The manufacturing process according to claim 1, wherein forming the supporting dielectric region includes:
   forming a first dielectric region directly on the anode region, the first dielectric region defining a side wall of a cavity formed on the semiconductor body; and
   forming a second dielectric region having a first portion supported on the first dielectric region and a second portion suspended over the cavity, the sensitive region being formed on the second portion of the second dielectric region and directly above the cavity.

8. The manufacturing process according to claim 1, further comprising:
   forming a resistive region on the front surface and in contact with the anode region; and
   forming a photodiode metallization on the resistive region and electrically connected to the anode region through the resistive region.

9. A method of forming an electronic device, the method comprising:
   forming a semiconductor device for flame detection, wherein forming the semiconductor device includes:
      forming an anode region in a semiconductor body having a first conductivity type and a front surface and including a cathode region, the anode region having a second conductivity type, extending within said semiconductor body starting from the front surface, and forming, together with the cathode region, a junction of a photodiode configured to detect ultraviolet radiation emitted by flames;
      forming a supporting dielectric region on the semiconductor body; and
      forming a sensitive region arranged on the supporting dielectric region and having a resistance that is configured to vary as a function of infrared radiation emitted by the flames; and forming a package containing the semiconductor device.

10. The method according to claim 9, further comprising forming an optical opening in the package includes and optically arranging an optical filter between the optical opening and the semiconductor device.

11. The method according to claim 9, comprising forming an array of semiconductor devices that includes the semiconductor device, wherein forming the package includes containing the array of semiconductor devices in the package.

12. A method of forming a flame-detection system, comprising:
forming a semiconductor device by steps including:
forming an anode region in a semiconductor body having a first conductivity type and a front surface and including a cathode region, the anode region having a second conductivity type, extending within said semiconductor body starting from the front surface, and forming, together with the cathode region, a junction of a photodiode configured to detect ultraviolet radiation emitted by flames;
forming a supporting dielectric region on the semiconductor body; and
forming a sensitive region arranged on the supporting dielectric region and having a resistance that is configured to vary as a function of infrared radiation emitted by the flames, wherein said photodiode is configured to generate avalanche currents in response to absorption of ultraviolet photons;
electrically coupling, to the semiconductor device, a first electronic circuit configured to generate a first electrical signal indicating that the avalanche currents generated by the photodiode have exceeded a current threshold;
electrically coupling, to the semiconductor device, a second electronic circuit configured to generate a second electrical signal indicating the resistance of the sensitive region; and
electrically coupling, to the first and second electronic circuits, a processing unit configured to determine quantities indicating detection of said ultraviolet radiation and of said infrared radiation as a function of the first and second electrical signals, respectively.

13. The method according to claim 12, wherein forming the semiconductor device includes:
forming a resistive region on the front surface and in contact with the anode region; and
forming a photodiode metallization that is electrically connected to the anode region through the resistive region.

14. The method according to claim 12, comprising forming a bridge dielectric structure, which includes the supporting dielectric region, contacts the semiconductor body, and delimits a cavity arranged on the semiconductor body, the sensitive region extending directly over the cavity.

15. The method according to claim 12, wherein forming the supporting dielectric region includes:
forming, on the front surface, a first dielectric layer;
forming, within the first dielectric layer, an opening;
forming, in the opening, a filling region of a first metal material;
forming a second dielectric layer on the filling region and the first dielectric layer, the filling region being accessible laterally through a pair of lateral openings; and
removing the filling region to form a cavity directly under the sensitive region.

16. The method according to claim 12, wherein forming the supporting dielectric region includes:
forming a first dielectric region directly on the anode region, the first dielectric region defining a side wall of a cavity formed on the semiconductor body; and
forming a second dielectric region having a first portion supported on the first dielectric region and a second portion suspended over the cavity, the sensitive region being formed on the second portion of the second dielectric region and directly above the cavity.

17. A process for manufacturing a semiconductor device for flame detection, the process comprising:
forming, on a front surface of a semiconductor body, a first dielectric layer;
forming, within the first dielectric layer, an opening;
forming, in the opening, a filling region of a first metal material;
forming a second dielectric layer on the filling region and the first dielectric layer, the filling region being accessible laterally through a pair of lateral openings;
forming, on the second dielectric layer, a sensitive region having a resistance configured to vary as a function of the infrared radiation emitted by the flames; and
removing the filling region to form a cavity directly under the sensitive region.

18. The process according to claim 17, further comprising:
forming a trench through the first and second dielectric layers;
forming, in contact with the sensitive region, a pair of sensor metallizations of a second metal material, different from the first metal material;
forming in the trench a photodiode metallization of a third metal material, different from the first metal material; and subsequently; and
selectively removing the filling region by a wet etch.

19. The process according to claim 18, wherein the third metal material is the same as the second metal material; and the sensitive region is made of a material different from the first metal material.

20. The process according to claim 17, further comprising, after removal of the filling region:
forming a coating of dielectric material on the sensitive region and the second dielectric layer, so that said coating closes the lateral openings of the cavity;
selectively removing a first portion of the coating arranged in contact with the second dielectric layer and a second portion of the coating arranged in contact with the sensitive region;
selectively removing an exposed portion of the second dielectric layer and an underlying portion of the first dielectric layer so as to form a trench;
forming a pair of sensor metallizations in contact with the sensitive region; and
forming in the trench a photodiode metallization.

* * * * *